(12) United States Patent
Arslan et al.

(10) Patent No.: US 11,990,920 B2
(45) Date of Patent: May 21, 2024

(54) ARTIFICIAL INTELLIGENCE AUGMENTED ITERATIVE PRODUCT DECODING

(71) Applicant: QUANTUM CORPORATION, San Jose, CA (US)

(72) Inventors: Suayb S. Arslan, Cambridge, MA (US); Turguy Goker, Oceanside, CA (US)

(73) Assignee: Quantum Corporation, San Jose, CA (US)

(*) Notice: Subject to any disclaimer, the term of this patent is extended or adjusted under 35 U.S.C. 154(b) by 34 days.

(21) Appl. No.: 18/091,605

(22) Filed: Dec. 30, 2022

(65) Prior Publication Data

US 2023/0216522 A1 Jul. 6, 2023

Related U.S. Application Data

(60) Provisional application No. 63/266,270, filed on Dec. 30, 2021.

(51) Int. Cl.
*H03M 13/00* (2006.01)
*H03M 13/11* (2006.01)

(52) U.S. Cl.
CPC .............................. *H03M 13/1105* (2013.01)

(58) Field of Classification Search
CPC ............. H03M 13/09; H03M 13/3746; H03M 13/6343; H03M 13/1105; H03M 13/15; H03M 13/03; H03M 13/2975
See application file for complete search history.

(56) References Cited

U.S. PATENT DOCUMENTS

| | | | |
|---|---|---|---|
| 9,098,411 B1 * | 8/2015 | Varnica | G11B 20/1833 |
| 9,287,900 B2 * | 3/2016 | Cideciyan | H03M 13/2927 |
| 9,564,925 B1 * | 2/2017 | Bentley | H03M 13/1515 |
| 9,998,151 B2 * | 6/2018 | Kim | G06F 11/1048 |
| 10,218,384 B2 * | 2/2019 | Sharon | G06F 3/064 |
| 11,515,897 B2 * | 11/2022 | Cho | G06F 3/0679 |
| 11,664,826 B2 * | 5/2023 | Lee | H03M 13/3707 |
| | | | 714/758 |

* cited by examiner

*Primary Examiner* — Esaw T Abraham
(74) *Attorney, Agent, or Firm* — Roeder & Broder LLP; James P. Broder

(57) ABSTRACT

A method for product decoding within a data storage system includes receiving data to be decoded within a first decoder; performing a plurality of decoding iterations to decode the data utilizing a first decoder and a second decoder; and outputting fully decoded data based on the performance of the plurality of decoding iterations. Each of the plurality of decoding iterations includes (i) decoding the data with the first decoder operating at a first decoder operational mode to generate once decoded data; (ii) sending the once decoded data from the first decoder to the second decoder; (iii) receiving error information from the first decoder with an artificial intelligence system; (iv) selecting a second decoder operational mode based at least in part on the error information that is received by the artificial intelligence system; and (v) decoding the once decoded data with the second decoder operating at the second decoder operational mode to generate twice decoded data; and outputting fully decoded data based on the performance of the plurality of decoding iterations.

20 Claims, 15 Drawing Sheets

| Misclassification? | Original | Classification Result | Implication | Action/Correction | Outcome |
|---|---|---|---|---|---|
| No MC | Class A | Class A | OK | Do Nothing | Correct Behavior |
| MC1 | Class A | Class B | Fail to find Error | Remove Erasure Label (Class D) | Need guard bytes to compensate |
| MC2 | Class A | Class C | Fail to label "error" as erasure | Label error as erasure (Class A) | Correct Behavior |
| MC3 | Class A | Class D | OK | Do Nothing | Need guard bytes to compensate |
| MC4 | Class D | Class A | OK | Do Nothing | Waste of C2 correction power |
| MC5 | Class D | Class B | Label "no-error" as erasure | Remove Erasure Label (Class D) | Correct Behavior |
| MC6 | Class D | Class C | Misdetect error | Label error as erasure (Class A) | Waste of C2 correction power |
| No MC | Class D | Class D | OK | Do Nothing | Correct Behavior |

Fig. 8

ARTIFICIAL INTELLIGENCE AUGMENTED ITERATIVE PRODUCT DECODING

RELATED APPLICATION

This application claims priority on U.S. Provisional Application Ser. No. 63/266,270 filed on Dec. 30, 2021 and entitled "ARTIFICIAL INTELLIGENCE AUGMENTED ITERATIVE PRODUCT DECODING". As far as permitted, the contents of U.S. Provisional Application Ser. No. 63/266,270 are incorporated in their entirety herein by reference.

BACKGROUND

Automated data storage systems, such as automated tape library systems, optical disk data storage systems, hard disk data storage systems, DNA data storage systems, RNA data storage systems, solid state drives or other automated data storage systems, are commonly utilized for purposes of writing data to and reading data from data storage devices, such as tape cartridges, optical disks, hard disks, DNA storage devices, RNA storage devices, solid state drives or other suitable data storage devices. For example, automated tape library systems typically include a robotic tape cartridge mover that selectively retrieves and/or moves tape cartridges as desired between storage slots and tape drives within the tape library. More specifically, upon receiving a signal to access a certain tape cartridge, the tape cartridge mover can be manipulated to physically retrieve the requested tape cartridge from its associated storage slot in the tape library. Subsequently, the tape cartridge mover moves the tape cartridge to an appropriate tape drive, and inserts the tape cartridge into a drive housing of the tape drive so that requested read/write operations can be performed. Upon completion of the requested read/write operations, the tape cartridge mover can then return the tape cartridge to an appropriate storage slot.

Unfortunately, many errors can occur during such reading and writing of data within such automated data storage systems. More specifically, in conventional systems, due to the magnetic nature of recording and decoupled drive-media combinations, error rates in such data can cause incorrect data to be read back from storage. Accordingly, it is desired to develop a system and method that enables improved product decoding to ensure more accuracy and reduced error rates in data reading as compared to the conventional systems.

SUMMARY

The present invention is directed toward a method for product decoding within a data storage system. In various embodiments, the method includes receiving data to be decoded within a first decoder; performing a plurality of decoding iterations to decode the data utilizing a first decoder and a second decoder; and outputting fully decoded data based on the performance of the plurality of decoding iterations. In many embodiments, each of the plurality of decoding iterations includes (i) decoding the data with the first decoder operating at a first decoder operational mode to generate once decoded data; (ii) sending the once decoded data from the first decoder to the second decoder; (iii) receiving error information from the first decoder with an artificial intelligence system; (iv) selecting a second decoder operational mode based at least in part on the error information that is received by the artificial intelligence system; and (v) decoding the once decoded data with the second decoder operating at the second decoder operational mode to generate twice decoded data; and outputting fully decoded data based on the performance of the plurality of decoding iterations.

In some embodiments, the step of selecting includes the second decoder operational mode being based at least in part on side information from the first decoder and the error information that is received by the artificial intelligence system.

In certain embodiments, the step of decoding the data with the first decoder includes the first decoder operational mode being updated for each of the plurality of decoding iterations.

In many embodiments, the method further includes running the artificial intelligence system to feed a correction block and a symbol classifier to determine the first decoder operational mode for the first decoder and the second decoder operational mode for the second decoder.

In some embodiments, for each of the plurality of decoding iterations, the method further includes receiving second error information from the second decoder with the artificial intelligence system.

In certain embodiments, the step of selecting includes selecting the second decoder operational mode based at least in part on the error information that is received from the first decoder and the second error information that is received from the second decoder by the artificial intelligence system.

In some embodiments, the method further includes processing the data with a detector prior to decoding the data with the first decoder.

In certain embodiments, the method further includes generating channel reliability information with a channel reliability estimator based on output from the detector; and receiving the channel reliability information with the artificial intelligence system to supplement the error information that is received by the artificial intelligence system.

In some embodiments, the step of receiving error information includes the artificial intelligence system being a joint deep neural network.

In certain embodiments, the method further includes adding an extra layer to the joint deep neural network for each subsequent decoding iteration.

In some embodiments, for each of the plurality of decoding iterations, the method further includes assigning one of "Error", "Erasure" and "Correct" with the first decoder for a state of the once decoded data.

In certain embodiments, for each of the plurality of decoding iterations, the method further includes assigning an accuracy to the decoding of one accurate erasure information, false erasure information, unlabeled error and correctly labeled good data.

In some embodiments, the step of decoding the data with the first decoder includes the first decoder being a C1 decoder; and the step of sending the once decoded data from the first decoder to the second decoder includes the second decoder being a C2 decoder.

The present invention is further directed toward a data storage system including a product decoding system including: a first decoder that is configured to receive data, the first decoder being further configured to operate at a first decoder operational mode to decode the data to generate once decoded data; a second decoder that is configured to receive the once decoded data, the second decoder being further configured to operate at a second decoder operational mode to decode the once decoded data to generate twice decoded data; and an artificial intelligence system that is configured to receive error information from the first decoder; wherein the product decoding system is configured to perform a plurality of decoding iterations to decode the data; wherein the second decoder operational mode is selected based at least in part on the error information that is received by the artificial intelligence system; and wherein the product decoding system is configured to output fully decoded data based on the performance of the plurality of decoding iterations.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIGS. 6A and 6B illustrate example 4-class maps for C1 and C2 codes;

FIG. 8 provides a table with a summary of all potential cases for misclassification, in one embodiment;

Figure 1:
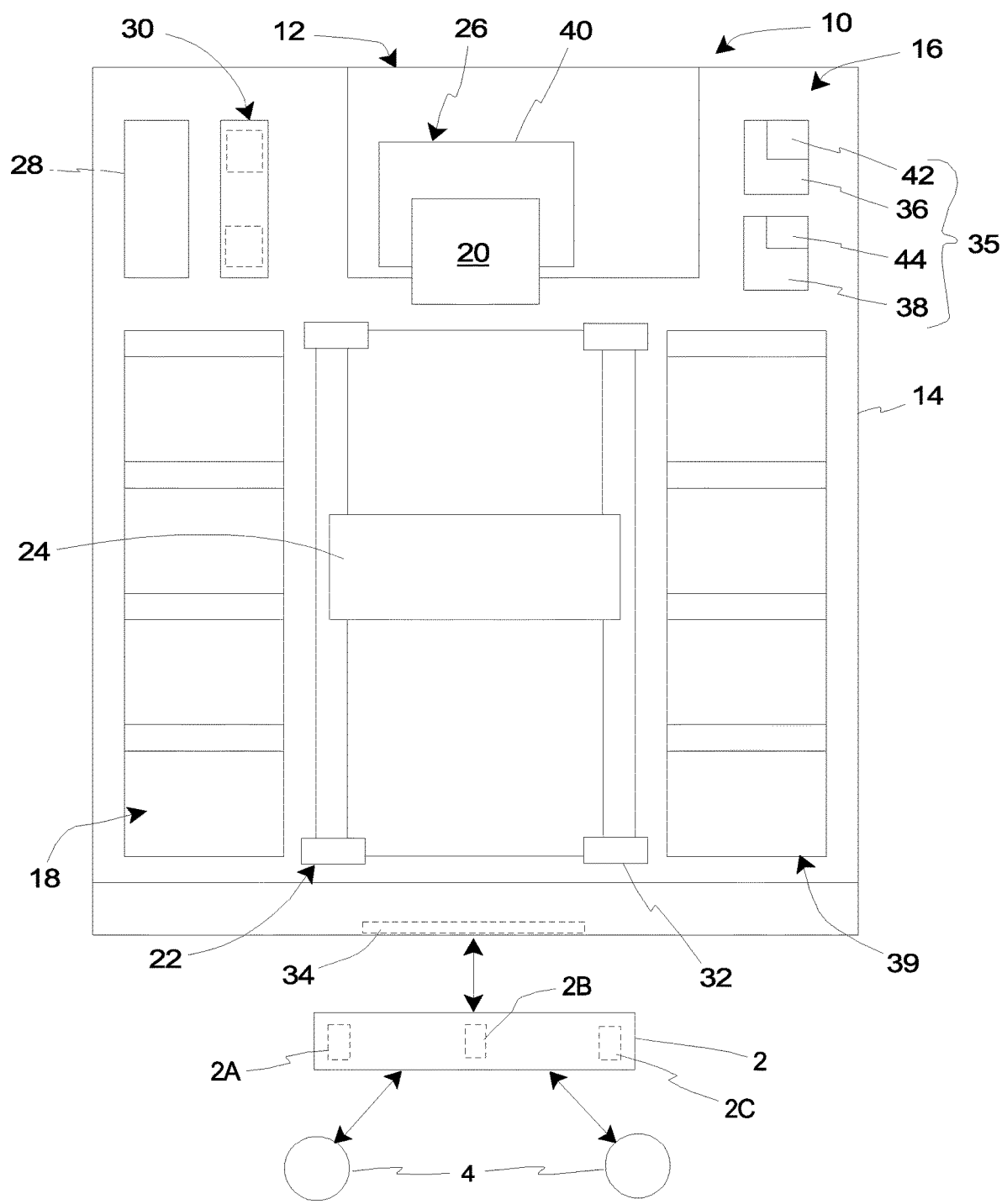
FIG. 1 is a simplified schematic top view illustration of an embodiment of an automated tape library system that can be utilized with the present invention.

While embodiments of the present invention are susceptible to various modifications and alternative forms, specifics thereof have been shown by way of example and drawings, and are described in detail herein. It is understood, however, that the scope herein is not limited to the particular embodiments described. On the contrary, the intention is to cover modifications, equivalents, and alternatives falling within the spirit and scope herein.

DESCRIPTION

Embodiments of the present invention are described herein in the context of a system and method for implementing artificial intelligence augmented iterative product decoding. In particular, in many embodiments, the present invention is uniquely configured to utilize machine-learning for low complexity, smart iterative product decoding. More specifically, the present application describes a decoding scheme for improving the ability to read stored data, which makes use of low-complexity approaches and reaches high performance accuracy (reduced number of errors). There are various ways to improve the decoding performance of the current state-of-the-art product decoding. In this application, an iterative scheme is described that improves product decoding through cooperation, using decoding mode selection, and cooperative/iterative decoding. Moreover, unlike prior approaches, the present mechanism further makes use of machine-learning and/or artificial intelligence techniques that enhance the choice of optimal modes of operation for the decoders.

In various embodiments, the present invention leverages various computer functionalities to provide a versatile solution for data decoding, and further enables prolonging of data retention and/or data health for archival storage. Thus, in many embodiments, the system and method of the present invention is able to provide enhanced correction capability (with more correct decoding), with greater speed of correction, thereby minimizing wear on various system components and requiring lower energy consumption than in conventional systems.

Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same or similar reference indicators will be used throughout the drawings and the following detailed description to refer to the same or like parts.

In the interest of clarity, not all of the routine features of the implementations described herein are shown and described. It will, of course, be appreciated that in the development of any such actual implementations, numerous implementation-specific decisions must be made in order to achieve the developer's specific goals, such as compliance with application-related and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 1 is a simplified schematic top view illustration of one or more hosts 2 (only one is illustrated in FIG. 1), one or more users 4 (two are illustrated in FIG. 1), and an automated data storage system (also referred to simply as a "data storage system") that can be utilized with the present invention. In one embodiment, as shown in FIG. 1, the data storage system can be a magnetic tape library system 10 (also referred to herein simply as a "tape library"). Alternatively, the data storage system can be an optical disk data storage system, a solid-state drive system, a hard disk data storage system, a DNA data storage system, an RNA data storage system, or another suitable data storage system.

As illustrated, the one or more hosts 2 provide a means of access to the tape library 10 for the one or more users 4. Moreover, during operation, the one or more users 104 can issue requests or instructions to the tape library 10 that are forwarded via the one or more hosts 2. The one or more hosts 2 can include host firmware 2A (illustrated as a box in phantom), host hardware 2B (illustrated as a box in phantom) and host software 2C (illustrated as a box in phantom) for purposes of forwarding user requests to the tape library 10 and/or for performing any other functions of the one or more hosts 2.

It is appreciated that while the present invention is being illustrated and described in a manner where the artificial intelligence augmented iterative product decoding system is incorporated within a tape library 10, or other suitable data storage system such as a pool of solid-state drives, the artificial intelligence augmented iterative product decoding system can alternatively be utilized with a stand-alone drive or other suitable storage system.

The tape library 10 includes a tape drive system 12 that includes one or more tape drives 26 that are usable for writing data to and reading data from magnetic tape 250 (illustrated in FIG. 2) that is retained within a tape cartridge 20. In FIG. 1, a top cover (not shown) has been omitted for clarity so that the interior of the tape library 10 is visible. The design of the tape library 10 can be varied as desired. In particular, the tape library 10 can have any suitable design that is capable of storing a plurality of tape cartridges 20 and using one or more tape drives 26 to write data to and read data from the plurality of tape cartridges 20. More specifically, it is noted that the tape library 10 illustrated in FIG. 1 is just one non-exclusive example of a tape library 10 usable with the present invention, and no limitations are intended based on the specific type and/or size of the tape library 10 shown in FIG. 1.

In various embodiments, as illustrated in FIG. 1, the tape library 10 can include one or more of: (i) a library housing 14 that defines a library interior 16, (ii) a plurality of storage slots 18 that are each configured to receive and selectively retain (and store) a tape cartridge 20, (iii) a rack assembly 22 including one or more racks 32, (iv) a tape cartridge retrieval assembly 24 (also referred to herein as a "retrieval assembly"), (v) the tape drive system 12 including the one or more tape drives 26, (vi) a power supply 28, (vii) a library control system 30, (viii) a graphical user interface 34 (illustrated in phantom, and also sometimes referred to herein as a "GUI"), and (ix) a climate controller 35. In some embodiments, the climate controller 35 can include one or more temperature controllers 36 (only one temperature controller 36 is illustrated in FIG. 1), and/or one or more humidity controllers 38 (only one humidity controller 38 is illustrated in FIG. 1).

As an overview, in various embodiments, the present invention can incorporate a cloud-based learning system that can transmit information to and from the tape drives 26 via the one or more hosts 2 and/or via the tape library 10, such as via the library control system 30, in order to effectively implement the artificial intelligence augmented iterative product decoding system described in detail herein. In many embodiments, the artificial intelligence augmented iterative product decoding system can provide various advantages and/or benefits to the data storage system, such as, but not limited to, one or more of (i) enhanced correction capability such that more product decoding is done correctly, (ii) enhanced speed of correction capability as the iterations can be conducted more quickly and efficiently due to alternative modes of operation, (iii) a more streamlined product decoding process, (iv) reduced power consumption requirements for the overall system, and (v) less wear on various system components, such as tape heads and the magnetic tape 250 itself, due to fewer iterations being required to ensure proper product decoding.

Such advantages and/or benefits are realizable in comparison to current, conventional systems that do not sense the channel state and ever-changing global environmental conditions, such as temperature, humidity or atmospheric pressure, as well as the conditions of various components such as the tape heads, the magnetic tape, etc. Therefore, in conventional systems, the hardware design decisions are made without any adaptation to nature of physical degradations, particularly with current systems with greatly increased areal densities. For instance, in conventional systems, C2 decoding assumes two bytes for guarding against byte errors and the rest of the redundancy are used for erasure (bytes in error whose locations are known) correction. Despite the fact that C1-C2 decoders admit different modes of operation, this division of correction power is fixed at the design phase and may not be optimal under different failure conditions/environmental circumstances. Also, such suboptimal operation decreases the lifespan of system components, increase aging and system operation inefficiency and results in more salient failures inside the system. Simply stated, conventional systems lack adaptation due to the fact that the different modes of operation are fixed at the design phase. In the best case, expert analysis could be done on the offline data. However, prevention mechanisms must be built-in to the system to be of any effect to precautionary maintenance. Conversely, the assistive role of the learning module as disclosed in the present invention is being a wrapper with minimum change to the available and highly optimized decoding hardware.

The library housing 14 is configured to retain various components of the tape library 10. For example, in the embodiment illustrated in FIG. 1, the plurality of storage slots 18, the rack assembly 22 including the rack(s) 32, the retrieval assembly 24, the one or more tape drives 26 of the tape drive system 12, the power supply 28, the library control system 30, and the climate controller 35 can all be received and retained at least substantially, if not entirely, within the library interior 16 that is defined by the library housing 14. As illustrated in FIG. 1, the library housing 14 can be rigid and can have a substantially rectangular-shaped cross-section. Alternatively, the library housing 14 can have another suitable shape or configuration. For example, the library housing 14 can have a substantially square-shaped cross-section or any other suitable shaped cross-section. In many embodiments, the library housing 14 may be constructed of any number of conventional materials such as, for example, those utilized in industry standard rack mount cabinets.

In the embodiment shown in FIG. 1, the plurality of storage slots 18 can be positioned within the library housing 14, with the storage slots 18 being configured to receive and retain (and store) the tape cartridge(s) 20. More particularly, in various embodiments, each of the storage slots 18 is configured to receive and retain a single tape cartridge 20. It is noted that no tape cartridges 20 are shown as being retained within the storage slots 18 in FIG. 1 for clarity.

The tape library 10 can include any suitable number of storage slots 18, and/or the tape library 10 can be designed to retain any suitable number of tape cartridges 20. Moreover, the storage slots 18 can be arranged within the tape library 10 in any suitable manner. For example, in certain embodiments, the tape library 10 can include forty storage slots 18 arranged in two four-by-five storage areas. More particularly, in this embodiment, the tape library 10 includes two magazines 39, one on each side of the retrieval assembly 24, with each magazine 39 including four columns of storage slots 18, and with each column having five storage slots 18 oriented substantially horizontally one on top of another (with limited spacing therebetween). It is understood that from the simplified top view shown in FIG. 1, the number of storage slots 18 in each column is not readily apparent. Alternatively, the tape library 10 can include greater than forty or fewer than forty storage slots 18 and/or the storage slots 18 can be arranged in a different manner than is illustrated and described in relation to FIG. 1. For example, in certain non-exclusive alternative embodiments, the tape library 10 can be configured to include hundreds or even thousands of storage slots 18, each being configured to receive and retain a separate tape cartridge 20.

The design and configuration of the rack assembly 22 can be varied to suit the specific requirements of the tape library 10. For example, in one non-exclusive embodiment, the rack assembly 22 can include four individual racks 32 that are spaced apart from one another. In some embodiments, each rack 32 can be oriented in a generally vertical direction and can extend a height that is sufficient to enable the retrieval assembly 24 to effectively retrieve a tape cartridge 20 from any of the plurality of storage slots 18. Alternatively, the rack assembly 22 can include a different number of racks 32. For example, in some non-exclusive alternative embodiments, the rack assembly 22 can include two racks 32, three racks 32 or more than four racks 32 that can be spaced apart from one another.

The retrieval assembly 24 selectively, such as upon request of a user 4 or host application 2, retrieves and moves the tape cartridge 20 as desired between the storage slots 18 and the tape drives 26. In particular, during use, upon receiving a signal from the library control system 30 to access a certain tape cartridge 20, the retrieval assembly 24 can be manipulated to physically retrieve the requested tape cartridge 20 from its associated storage slot 18 in the tape library 10. Subsequently, the retrieval assembly 24 moves the tape cartridge 20 to an appropriate tape drive 26, and inserts the tape cartridge 20 into a drive housing 40 of the tape drive 26 so that the requested read/write operations can be performed. Upon completion of the requested read/write operations, the retrieval assembly 24 can then return the tape cartridge 20 to an appropriate storage slot 18. It is appreciated that a similar protocol can be run for other storage systems, such as DNA libraries in which the tape cartridge can be replaced with DNA microcentrifuge tubes, tape drives can be replaced with synthesizers/sequencers, tape libraries can be replaced with DNA containers, etc.

It is appreciated that although a single retrieval assembly 24 is illustrated in FIG. 1, the tape library 10 can be designed to include more than one retrieval assembly 24. For example, in one non-exclusive alternative embodiment, the tape library 10 can include two retrieval assemblies 24 that function in different portions of the tape library 10 and/or that provide redundancy in the event that one of the retrieval assemblies 24 fails.

The one or more tape drives 26 can be configured for reading and/or writing data with respect to the tape cartridge 20. The number of tape drives 26 provided within the tape library 10 can be varied to suit the specific requirements of the tape library 10. For example, in certain embodiments, the tape library 10 can include three tape drives 26 that are stacked substantially one on top of another (with limited spacing therebetween). Alternatively, the tape library 10 can include greater than three or fewer than three tape drives 26 and/or the tape drives 26 can be positioned in a different manner relative to one another. For example, in certain non-exclusive alternative embodiments, the tape library 10 can be configured to include one hundred or more tape drives 26.

In certain embodiments, the tape library 10 can include more than a single tape drive system 12 for purposes of providing the one or more tape drives 26. For example, in some embodiments, the tape library 10 can include a plurality of tape drive systems 12, with each tape drive system 12 including one or more individual tape drives 26. In one embodiment, the tape library 10 can include three individual tape drive systems 12, with each tape drive system 12 including a single tape drive 26, to provide a total of three tape drives 26 for the tape library 10. Alternatively, the tape library 10 can include any desired number of tape drive systems 12 and/or tape drives 26.

The power supply 28 provides electrical power in a well-known manner to the one or more tape drives 26, the retrieval assembly 24, the library control system 30 and/or additional tape libraries 10. The power supply 28 can be interfaced with these components as well as with an external power source in a well-known manner using industry standard cabling and connections. Alternatively, the power supply 28 can be interfaced with these components in another manner.

The library control system 30 provides the desired and necessary control for oversight functionality of the tape library 10. The library control system 30 can have any suitable design, many of which are well-known in the industry. For example, in one embodiment, the library control system 30 can include a standard driver interface unit for receiving digital commands and translating the commands into driving currents, such as step pulses for controlling stepper motors, and/or for controlling the climate controller 35. In another embodiment, the library control system 30 can include a standard programmable general-purpose computer formed on a single plug-in card unit and can include a programmed microprocessor or microcontroller, memory, communication interface, control interface, connectors, etc. Alternatively, the library control system 30 can have a different design and/or the library control system 30 can be positioned within the tape library 10 in a different position or manner than that illustrated in FIG. 1.

The tape library 10 can use well-known industry standard cabling and communication protocols between the library control system 30 and other structures of the tape library 10. Cabling and electrical characteristics including signaling protocols can be generally standardized, and the logical message protocols can be either proprietary or standardized as known to those skilled in the art.

As shown, the tape library 10 can also include the GUI 34, such as an interactive touchscreen graphical user interface or another suitable graphical user interface, which allows the user or host to interact with and/or transmit requests or commands to and/or from the tape library 10.

The climate controller 35 controls the climate within the library interior 16. In various embodiments, the climate controller 35 can regulate, adjust, control and/or maintain a specific climate within the library interior 16. In certain embodiments, at various times, the specific climate that is regulated, adjusted, controlled and/or maintained by the climate controller 35 within the library interior 16 can be based on a climate outside of the library interior 16. As noted, in certain embodiments, the climate controller 35 includes the temperature controller 36 and the humidity controller 38.

The temperature controller 36 regulates and/or adjusts the temperature within the library interior 16 of the tape library 10. The design and/or particular type of temperature controller 36 included in the tape library 10 can vary. For example, the temperature controller 36 can include any suitable type of cooling unit that can selectively lower the temperature within the library interior 16; and/or the temperature controller 36 can include any suitable type of heating unit that can selectively increase the temperature within the library interior 16. In various embodiments, the temperature controller 36 can include one or more temperature sensors 42 (only one temperature sensor 42 is illustrated in FIG. 1) that can sense an ambient temperature within or outside of the library interior 16. The temperature sensor(s) 42 can have any suitable design and/or can be positioned in any suitable location(s), such as within and outside of the library interior 16 of the tape library 10. In certain embodiments, the temperature controller 36 can receive data from the temperature sensor 42, and automatically adjust and/or control the temperature within the library interior 16 in accordance with predetermined temperature standards based on such data.

The humidity controller 38 regulates and/or adjusts the humidity within the library interior 16 of the tape library 10. The design and/or particular type of humidity controller 38 included in the tape library 10 can vary. For example, the humidity controller 38 can include any type of humidifier or dehumidifier, or any other suitable type of humidity controller 38 that can selectively change (raise or lower) and/or control the humidity within the library interior 16. In various embodiments, the humidity controller 38 can include one or more humidity sensors 44 (only one humidity sensor 44 is illustrated in FIG. 1) that can sense the humidity within or outside of the library interior 16. The humidity sensor(s) 44 can have any suitable design and/or can be positioned in any suitable location(s), such as within and outside of the library interior 16 of the tape library 10. In certain embodiments, the humidity controller 38 can receive data from the humidity sensor 44, and automatically adjust and/or control the humidity within the library interior 16 in accordance with predetermined humidity standards based on such data.

Figure 2:
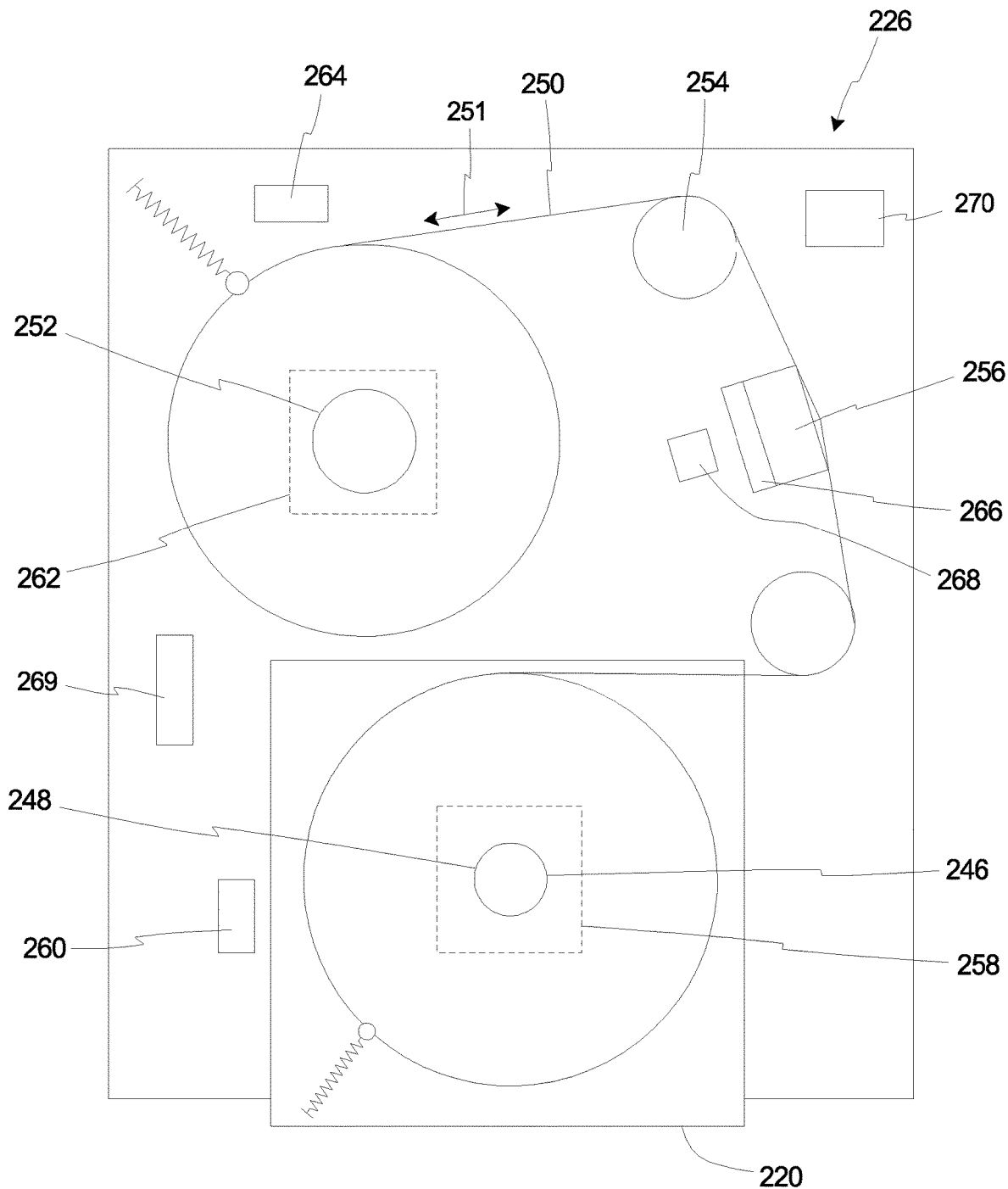
FIG. 2 is a simplified schematic top view illustration of a magnetic tape drive having features of the present invention, and a magnetic tape cartridge that has been inserted into the magnetic tape drive, which can be included as part of the tape library system illustrated in FIG. 1.

FIG. 2 is a simplified schematic top view illustration of a magnetic tape drive 226 having features of the present invention, and a magnetic tape cartridge 220 that has been inserted into the tape drive 226, which can be included as part of the tape library system 10 illustrated in FIG. 1. Alternatively, the magnetic tape drive 226 having features of the present invention can be provided and/or utilized in any suitable manner independently from the tape library system 10.

In FIG. 2, covers for the tape drive 226 and the tape cartridge 220 have been omitted for clarity so that the interior of such components is visible. As shown, the tape cartridge 220 is configured to retain a magnetic tape 250. It is appreciated that the tape drive 226 as shown in FIG. 2, in certain aspects, represents a generic tape drive in terms of overall size, shape and design, and is shown by way of example and not by way of limitation. In some embodiments, the tape drive 226 operates in compliance with an LTO specification, such as LTO-8 or LTO-9. Stated in another manner, in such embodiments, the tape cartridge 220 is an LTO-compatible tape cartridge.

During use of the tape drive 226, the tape cartridge 220 is inserted into a drive housing 240 of the tape drive 226 so that the tape drive 226 can read data from and/or write data to the tape cartridge 220. As shown, the tape cartridge 220 includes a cartridge reel 246 that includes and/or defines a cartridge hub 248. The magnetic tape 250 is spooled about the cartridge hub 248 of the cartridge reel 246. In certain embodiments, the magnetic tape 250 can include at least one servo track (not shown) and a plurality of data tracks (not shown) that run along a longitudinal length of the magnetic tape 250. Each of these tracks can be positioned substantially parallel to each other.

The tape cartridge 220 supplies the magnetic tape 250 to the tape drive 226. More particularly, when the tape cartridge 220 is inserted into the drive housing 240 of the tape drive 226, one end of the magnetic tape 250 is taken up within the tape drive 226 to be wrapped around a drive reel 252 included in the tape drive 226. The magnetic tape 250 traverses a predefined path 251 (illustrated as a two-headed arrow) between the cartridge reel 246 and the drive reel 252, which is defined, a least in part, by one or more rollers 254 (two are shown in FIG. 2) positioned at strategic positions along the predefined path 251. The rollers 254 may also aid in limiting gross lateral movement (i.e. in and out of the page as shown in FIG. 2) of the magnetic tape 250, sometimes referred to as lateral tape motion or "LTM".

Along the predefined path 251, the drive reel 252 moves the magnetic tape 250 across a tape head assembly 256 (also sometimes referred to herein as a "head assembly", "tape heads" or simply as a "head") that is configured to read data from and/or write data to the magnetic tape 250. In alternative embodiments, the head assembly 256 can include at least one read head, at least one write head, and at least one read/write head. In particular, the head assembly 256 is positioned in close proximity to the predefined path 251 of the magnetic tape 250 such that as the magnetic tape 250 travels in the longitudinal direction (by being wound from the cartridge reel 246 to the drive reel 252 or vice versa) the head assembly 256 can read/write data to particular tracks and longitudinal positions of the magnetic tape 250. The head assembly 256 and/or a separate head assembly can include one or more servo elements configured to read the servo track(s) of the magnetic tape 250 in order to effectively maintain proper alignment between the head assembly 256 and the magnetic tape 250. It is appreciated that the tape drive 226 can include any suitable number of heads within the head assembly 256 for purposes of reading data from and/or writing data to the magnetic tape 250. For example, in one non-exclusive embodiment, the head assembly 256 can include 32 heads for purposes of reading data from and/or writing data to 32 data tracks on the magnetic tape 250.

In some embodiments, as shown, the tape drive 226 can also include a cartridge reel motor 258 (illustrated as a box in phantom) that generates the necessary force to rotate the cartridge reel 246 at will, and a cartridge reel encoder 260, such as a sensor or detector, that is configured to output signals representing the pulse rate (or rotation rate) of the cartridge reel motor 258.

In certain embodiments, the tape drive 226 can include a drive reel motor 262 (illustrated as a box in phantom) that generates the necessary force to rotate the drive reel 252 at will, and a drive reel encoder 264, such as a sensor or detector, that is configured to output signals representing the pulse rate (or rotation rate) of the drive reel motor 262.

As illustrated in this embodiment, the tape drive 226 also includes an actuator 266 and a drive controller 268, including one or more processors and circuits, that can be communicatively coupled to the head assembly 256. The actuator 266 is configured to control the lateral position of the head assembly 256 and/or the individual heads of the head assembly 256 relative to the magnetic tape 250 based on a signal provided by the drive controller 268. As such, the actuator 266 comprises a mechanical positioner to move the head assembly 256 up or down laterally. By controlling the lateral position of the head assembly 256 relative to the magnetic tape 250, particular tracks of the magnetic tape 250 can be accessed as desired. Alternatively, the tape drive 226 can include more than one actuator 266. For example, the tape drive 226 can include a separate actuator 266 for each head.

The drive controller 268 is in communication with the actuator 266 and a number of other components within the tape drive 226. For example, although not specifically shown in FIG. 2, each of the cartridge reel motor 258, the cartridge reel encoder 260, the drive reel motor 262, and the drive reel encoder 264 can be in communication with the drive controller 268. As such, the drive controller 268 can be configured to perform various specified operations, either individually, or in combination with other software, hardware and/or firmware elements.

In certain embodiments, as shown, the tape drive 226 can further include drive hardware 270 (illustrated as a box) that incorporates a system or method, such as in the form of a specially designed algorithm, for purposes of artificial intelligence augmented iterative product decoding. Various features and embodiments of the artificial intelligence augmented iterative product decoding system will be described in greater detail herein below.

In various implementations, as described herein, the technical benefits of the present invention include, but are not limited to:

(1) The proposed scheme offers improved operation of the tape drive through an adaptive representational learning and an imperative online decision-making process that improves decoding performance via utilizing the full potential of the underlying physically implemented decoders, provides better reliability and counteracts measures for aging; and (2) For a given reliability target, the proposed scheme improves data recovery convergence rates such that fully decoded data can be achieved more quickly, which leads to less heavy use of hardware and less corresponding wear on the components, and therefore leads to energy efficiency which saves both time and money for the operator.

Moreover, the present invention leverages various computer functionalities to provide a versatile solution for data decoding and prolonging the data retention/health for archival storage.

Various features and aspects of the present invention will now be described in greater detail. For example, in various embodiments, the present invention entails a decoding scheme for improving the ability to read stored data, which makes use of low-complexity approaches and reaches high performance accuracy (reduced number of errors). There are various ways to improve the decoding performance of the current state-of-the-art product decoding. In this application, an iterative scheme is described that improves product decoding through decoder cooperation, using individual decoding mode selections, and synchronized cooperative/iterative decoding. The present mechanism further makes use of artificial intelligence and/or machine-learning techniques.

In many typical magnetic recording applications (such as optical disks, hard disk drives, tape systems, etc.), data is protected using a multidimensional code called product code. An m-dimensional product code consists of m different component codes structured in multiple orthogonal dimensions where any symbol of the code belongs to m codewords.

For instance, two-dimensional (2-D) product code encodes information in horizontal and vertical dimensions (for example, using the names C1 for the row code and C2 for the column code) and these component codes are typically selected to possess a Maximum Distance Separable (MDS) property. In other words, for any message of length k symbols (or data blobs), MDS encoding produces n symbols-long codeword (a block length of n) and any k symbols out of n symbols would be sufficient to reconstruct the original message of k symbols through an appropriate decoding process. This property secures storage-optimal reconstruction for a code with parameters k and n when there is a possibility of symbol erasures.

In this context, the rate of the code is defined to be k/n and the minimum distance ($d_{min}$) of the code is n−k+1. For a given rate, as the block length of the code increases, the error correction power of the code increases because it would span more message symbols for a given rate and deal with the total accumulated errors all at once, compared to encoding the same message symbols with multiple codes with shorter block length.

Reed-Solomon (RS) codes are one of the most popular class of codes with MDS property used in many storage devices today. The lowest-complexity algebraic decoding paradigm known to date for these codes is based on Bounded Distance Decoding (BDD). In BDD, decoding spheres of radius half the minimum distance, i.e. ($\lfloor d_{min}/2 \rfloor$), of the code are defined and as long as the perturbed codeword (symbols in the codeword plus added noise or error) happens to fall inside this sphere (including the boundary), the decoding will be successful. The algebraic hard-decision Berlekamp-Massey (BM) decoding algorithm is one such example of BDD. However, the BDD is not optimal as it would not give the maximum likelihood estimate of the intended codeword. It does, however, possess extremely low-complexity implementations and is frequently used in hardware implementations.

Due to the magnetic nature of recording and decoupled drive-media combinations (in particular for optical disks and tape), the data needs to be protected very heavily. A similar decoupling exists in DNA data storage as well where DNA sequencers (deoxyribonucleic acid (DNA) base-calling or data detector) and synthetic DNA are utilized to store data live in different places. DNA digital data storage is the process of encoding and decoding binary data to and from synthesized strands (a single or double helix) of nucleotides. DNA data storage systems encode digital information as a series of 0's and 1's using any combination of four bases or nucleotides that make up the genetic code, which for DNA are adenine (A), cytosine (C), guanine (G), and thymine (T). For example, G and C could be used to represent logical "0" while A and T represent logical "1". Or A can represent logical "00", C can represent logical "01", G can represent logical "10", and T can represent logical "11". Encoding followed by the synthesis process generates single and/or double strands of A, G, C and T molecules representing the digital data. The nucleotides may also include special timing marks for easy detection. Similar decouplings are being observed with hard disk and solid-state drive systems as the systems are required to scale out for improved service quality, thereby making the claims of this disclosure applicable.

A two-dimensional product coding is one of the methods to generate long block length linear codes that can cope with such extreme adverse cases and still be able correct many errors by consecutive decodings of the component codes to ensure low complexity implementations. Component codes are typically selected to be RS codes. Due to complexity reasons, hard decision BDD (as compared to soft decision) is the preferred decoding method in today's technology. In a low-complexity, typical hard-decision decoding scenario, an MDS code can correct t errors and e erasures at the same time as long as the equation 2t+e≤n−k is satisfied, where n is the number of code words and k is the message length.

The code can correct more erasures than errors, which is subject to the availability of side information (such as information relating to error locations). Since erasures are technically nothing more than errors whose locations are known to the decoder, there has to be an external mechanism to tell the decoder where such errors occurred in order to benefit from the higher rate of correction for erasures and hence secure improved performance. Plus, that information needs to be reliable, otherwise, one of the two undesirable things can happen: (1) wrong message decoding and/or miscorrection of original information, or (2) correction power of the code may be wasted. In other words, the code could have corrected more than it actually can. For instance, suppose some symbols are treated as erasures, i.e., erroneously "erasure" labeled. Correct symbols will be treated as erasures and the decoder will calculate 0 to be added to these symbols to correct. However, this operation is not really a correction, but rather a waste of calculation/effort.

For every BDD of each component RS code, there are: $\lfloor (n-k)/2 \rfloor + 1$ distinct modes of operation and each component code can select one of these modes while decoding. These modes can be named as Mode 1 (for 0 errors and n−k erasures), Mode 2 (for 1 error and n−k−2 erasures), etc. In short, Mode i is used for correcting i−1 errors and n−k−2 (i−1) erasures. In the state of art, each component code (C1 with parameters $(n_1, k_1)$ and C2 with parameters $(n_2, k_2)$ is decoded once (in the order C1-C2) and the most common mode options are:

First, C1 @ Mode $\lfloor (n_1-k_1)/2 \rfloor + 1$, and then C2 @ Mode $\lfloor (n_2-k_2)/2 \rfloor + 1$ All component codes are operating at error correction modes.

First, C1 @ Mode $\lfloor (n_1-k_1)/2 \rfloor + 1$, and then C2 @ Mode 2

C1 is operating at error correction while C2 operates at almost all-erasure correction mode with two guard bytes (2 gb).

Option 1 is straightforward and component codes do not pass any side information to each other.

In option 2, the decoder of C1 code (C1 decoder) uses all of its power to correct for errors, i.e., a maximum of $\lfloor (n_1-k_1)/2 \rfloor$ errors can be corrected. However, if the number of errors is more than that (suppose that happens with probability $P_F$), the decoder may either flag failure or decode it to some other non-original codeword (a miscorrection). Although the miscorrection probability is less than $P_F/\lfloor (n_1-k_1)/2 \rfloor!$ [2], it is still non-zero, and this probability could be significant for small values of $n_1-k_1$ and hence needs to be addressed.

Option 2 takes this into account. In this option (and the mode of C2 decoder) whenever C1 decoder fails, the symbols in the entire row (the row codeword) are labeled as "erasure" for the C2 decoding (possible upon detection). Note that this is an optimal strategy as long as only the result of consecutive decodings is used. In case of miscorrection, the errors will be propagated unnoticed to the next stage. C2 decoder is operated on Mode 2 to correct for $n_2-k_2-2$ erasures. In this mode, the C2 decoder is allowed to correct for a single unnoticed error. This margin of two guard bytes of error correction is deliberately permitted to allow detection of C1 miscorrections and correct them by C2. Although extremely unlikely, if there are two or more C1 miscorrections out of $n_2$ symbols, then there would be a decoding failure (unsuccessful decoding) if detected by the C2 decoder. Another possibility involves cases where one or more errors may not be detected. It such cases, this can lead to data corruption. However, this is also an extremely unlikely scenario.

The iterative product decoding scheme of the present invention improves the decoding performance through cooperation of multiple decoding stages. In one embodiment, the scheme uses deep neural networks (DNN), a form of machine-learning and/or a computational model of intelligence, to learn the channel error characteristics and uses this knowledge to label data as errors/erasures/intact for each decoding stage at different iterations. This corresponds to selecting the right set of decoding modes of decoder over time to fully leverage the potential of the existing decoder implementation and eventually optimize the overall decoding performance. Furthermore, in one embodiment, detector input signal is used as reliability information. Decoder processing is shown to help with the DNN training, do transfer learning, and eventually reduce the number of iterations (to get to the final estimate) and hence the complexity of the system.

It is appreciated that, in various embodiments, the additional logic that is integrated within the AI-augmented iterative product decoding system of the present invention is so integrated such that the product decoding system is more effectively able to use the existing potential in the system hardware. It is not merely extra logic used as a means to improve performance. Rather, the additional logic actually improves the functionality of the existing system hardware, thereby improving overall performance of the product decoding system in comparison to what is possible with conventional systems.

In one embodiment, the system uses the best selection of decoding modes based on hard-decision. Hard-decision determines each value by considering it as 1 or 0, based on a threshold value. If it's above the threshold, it is decoded as 1 and otherwise it is decoded as 0. The decoding is done regardless of how close the value is to the threshold. The threshold can be varied based on the reliability of the decoder state.

Selecting the best decoding mode for each stage allows each component code to choose a best mode based on the reliable side information provided by the previous decoding stage. In one embodiment, this is linked with the error statistics. For instance, option 1 might be optimal for errors with uniform random characteristics. However, option 2 is preferable when errors in each row are highly correlated with each other. Such statistical information is taken into account for an optimal hard-decision product decoding, and hence to secure reliable long-term data retrieval. For example, if C1 decoder fails due to all symbols being in error, labeling the codeword symbols as "erasure" is optimal. In other words, no correct symbols are labeled as erasures.

In one embodiment, the system uses soft decision decoding of component codes. Soft-decision decoding takes a stream of bits or a block of bits and decodes them by considering a range of possible values that they may take. Soft-decision considers the reliability of each received pulse to more accurately estimate the data.

This choice allows soft intrinsic information to be passed between component codes. Since no information is lost (except due to hardware precision limitations) the decoding will enhance and benefit from access to the soft intrinsic information, and hence provide a better decoding performance.

However, the major limitation of such an option is its complexity of the implementation (both computationally and in terms of memory space used to represent floating numbers in bits—the more bits we use more precision we obtain). For RS codes, even the lowest complexity approaches to soft decoding, such as Chase Decoding, calls the Berlekamp-Massey (BM) algorithm multiple times to extract the necessary soft information. In other words, the utilization of the hard-decision decoding multiple times is the fundamental building block of the corresponding soft decoder. This allows the system to go beyond half the minimum distance of the component code decoding performance. There are both algebraic and probabilistic approaches to achieve this for each of the component codes.

In one embodiment, Cooperative Decoding (iterative product decoding) is used. The current state-of-the-art product decoding consists of running C1 and C2 decoding in a sequential manner only once. Since the decoding performance of each component code has an effect on the decoding performance of the next component code, iterating component code decodings in a particular order such as C1-C2-C1-C2 etc. has the potential to improve the data recoverability performance. In such an approach, it is important to identify if each decoding stage can generate accurate and useful side information to be used by the next decoding stage. This is usually achieved by an external mechanism.

In this disclosure, an iterative scheme is disclosed that improves product decoding through cooperation using a combination of hard-decoding and cooperative decoding, and machine-learning techniques as the external mechanism to provide side information for the decoding path.

In one embodiment, the system passes information between component codes. One of the most common and basic approaches to the generation of the side information to pass to the next decoding stage is to label symbols (with the use of a block of memory) as erasures (using only one pass of BM, if more passes are allowed better (soft) side information can be generated). This way the next decoding stage can operate using a lower mode (smaller) of operation. However, in a typical C1 decoding failure, the entire row is labeled as erasure, meaning that there are errors in that row that go beyond the correction capability of C1 decoder (half the minimum distance). Though most of the symbols in a row may be mistakenly labeled as erasures, introducing more resolution only by way of BM to distinguish between errors and erasures is not possible. Moreover, when the decoder cannot detect the errors (miscorrection), there is potential that some errors may propagate to the next decoding stage unnoticed.

In one embodiment, a byte can assume three states: "Error", "Erasure" or "Correct" for the present system. Although the smallest unit of data that is subject to being in error or erasure is labeled as a "byte", it should be understood that the data unit can be extended to cover "symbol" or "data blob" as the context allows.

Thus, characterizing the above scenarios, four possibilities are identified. These four possibilities can be summarized under the following classes:

Class A: The byte is in error and C1 decoder correctly identifies it as an error and labels it as an "erasure" in the memory.

Class B: The byte is correct (intact) and C1 decoder erroneously identifies it as an error, and treats it as an error, and hence labels it as an "erasure" in the memory.

Class C: The byte is in error and C1 decoder fails to identify it as an error in the memory.

Class D: The byte is correct and C1 decoder does not identify it as an error in the memory.

Table 1 summarizes these possibilities, as shown below:

TABLE 1

|  | Error | No error |
| --- | --- | --- |
| Labeled erasure | A (accurate erasure info) | B (false erasure info) |
| Not labeled erasure | C (bad due to unlabeled error) | D (good) |

In conventional systems, the C1 decoder cannot flag bytes individually. When C1 performs classification, groups of bytes are labeled all together, for instance, all the bytes of a codeword. Based on the classes listed above, Class A and Class D are the desirable classes which require no action. On the other hand, Class B and Class C are classes that which the system must take action to eliminate as much as possible. There is typically a trade-off between reducing the rates of Class C and Class B. In other words, when the rate of seeing Class B is reduced, the rate of seeing Class C typically increases.

To see this, consider the number of errors to be much larger than half the minimum distance of the C1/C2 code. In that case, since the entire codeword would be labeled as "erasure" if decoding failure is declared, the rate of Class B will be reduced. However, the excessive number of errors increases the chances of having a miscorrection (i.e., the possibility of ending up in another sphere which is not where the codeword originated from) which would increase the rate of Class C.

The artificial intelligence augmented iterative product decoding system described in the present application is designed to supply the decoding with an efficient external mechanism to reduce the rates of Class B and C, labeling mistakes at the same time while respecting the trade-off between them.

It is appreciated that, although the disclosure herein generally refers to the use and application of C1 decoders and C2 decoders, different types of decoders can also be used. For example, in certain implementations, the artificial intelligence augmented iterative product decoding system of the present invention can additionally and/or alternatively utilize C3 decoders. Thus, the reference to C1 decoders and C2 decoders is not intended to be limiting in any manner, except as specified in the claims appended hereto.

The disclosure now refers to FIGS. 3-12 for purposes of describing various features and aspects of the present invention in greater detail as a means to provide an artificial intelligence augmented iterative product decoding system with enhanced product decoding capabilities, while providing a streamlined process that enables reduced power consumption and reduced wear on various components, such as tape heads and the tape itself, as a result of fewer iterations being required.

Figure 3:
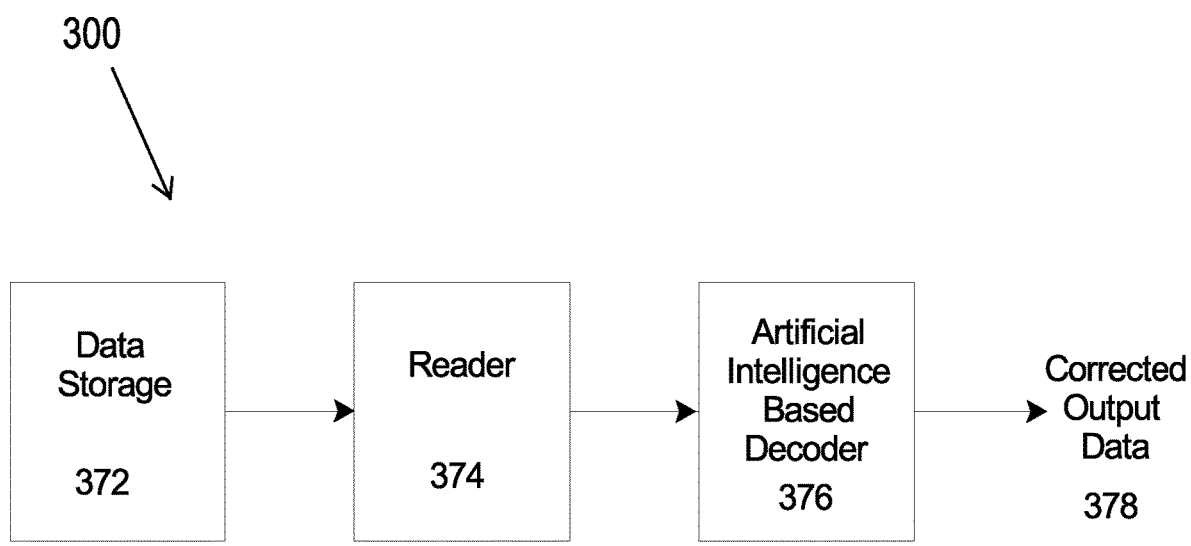
FIG. 3 illustrates one embodiment of a system in which an artificial intelligence augmented iterative decoder having features of the present invention may be used.

FIG. 3 illustrates one embodiment of an error decoding system 300 in which an artificial intelligence augmented iterative decoder may be used. As illustrated, a data storage device 372 is configured to store data, which in some embodiments has been recorded utilizing two-dimensional product coding. In alternative embodiments, the data storage device 372 may be tape drives, optical drives, DNA drives, solid-state drives or other storage for large volumes of data, which may have high error rates. In certain embodiments, the data is stored in an encoded form, using channel coding which generates long block length linear codes that can cope with extreme adverse conditions and still be able correct many errors by consecutive decodings of the component codes to ensure low complexity implementations. A reader 374 is then used to read data from the data storage device 372. The reader 374 then passes the data to an artificial intelligence-based decoder 376 (also referred to herein simply as a "decoder"). The decoder 376 utilizes iterative decoding, as will be described below, to decode the data, to correct any errors or erasures in the data. The decoder 376 outputs corrected output data 378 which may be used in various ways, as is known in the art. The AI-based decoder 376 provides an improvement to the functioning of a computer system, by providing more accurate data reading capabilities through experience.

In another embodiment, the data storage device 372 is a DNA drive which applies sequencing to retrieve data (obtain base sequence in terms of nucleotides). However, due to the physical realization of sequencers, varying translocation speeds and enzymatic reactions the data may be inserted/deleted (indel), erased, or even substituted. Hence to correct for all different types of errors, a concatenation of codes (that may be in the form of a product code) are used. Thus, a DNA drive can use an indel decoder followed by an iterative product decoder to correct any errors or erasures (substitution-type errors) in the data. Since sequencing is traditionally done by AI-based algorithms such as RNN or CNN, the proposed AI-augmentation can be cooperatively designed with data sequencing to further improve the performance. For example, a single neural network can be designed/trained to learn both the data/signal characteristics as well as error/failure patterns to decode the data.

Figure 4A:
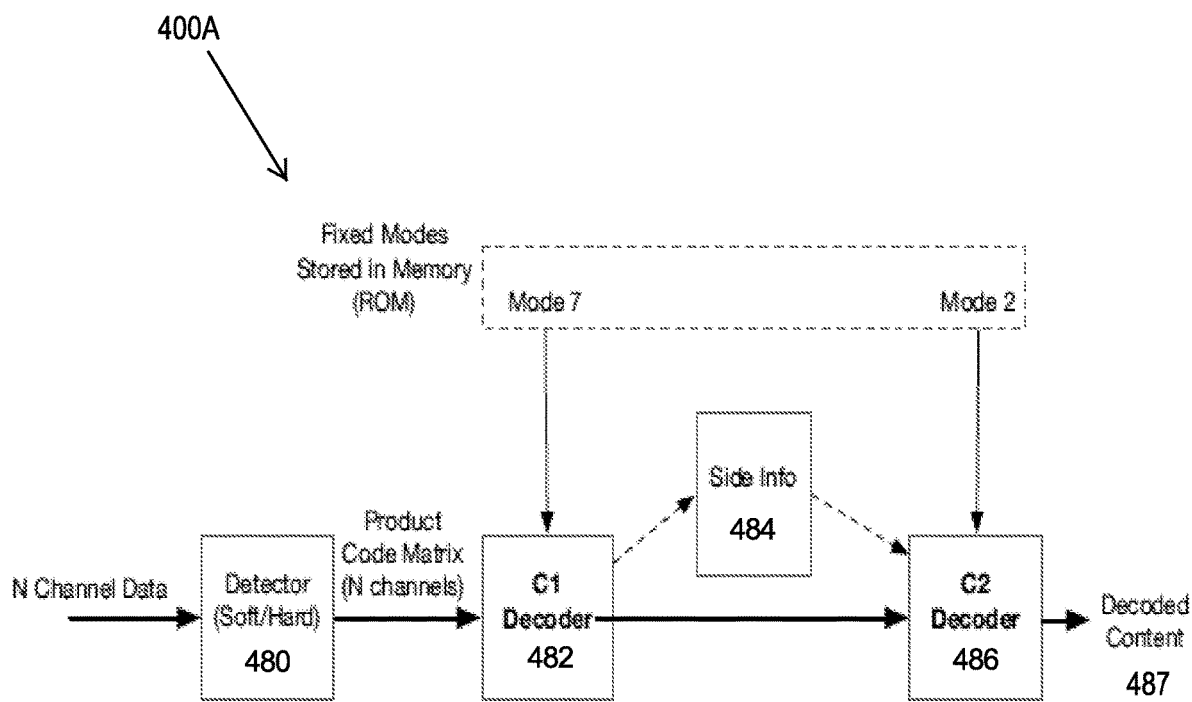
FIG. 4A illustrates one embodiment of a product decoding system with no iterations.

FIG. 4A illustrates one embodiment of a product decoding system 400A with no iterations. This figure illustrates the read channel of a classical linear tape-open (LTO) drive, starting from a detector 480 and the ECC blocks of two decoders, a C1 decoder 482 and a C2 decoder 486 in this particular embodiment, to provide decoded content 487. The bold arrows represent the data path where the data flows through the pipeline. The dotted arrows are the features that are used by the decoders 482, 486 to select appropriate modes of operation. For instance, in one non-exclusive implementation, the operational mode for the C1 decoder 482 may be set to 7, meaning that the C1 decoder 482 is in all-error correction mode. On the other hand, the operational mode for the C2 decoder 486 can be set to 2, meaning that it is set to correct ten erasures and a single error (assuming LTO-7 for this particular example). The mode of operation of the C2 decoder 486 can be configured by the mode information in memory and side information 484 and does not change. The selection of the operational mode for the C1 decoder 482 creates the side information 484 for the C2 decoder 486, indicating which symbols are to be labeled as "erasures".

Figure 4B:
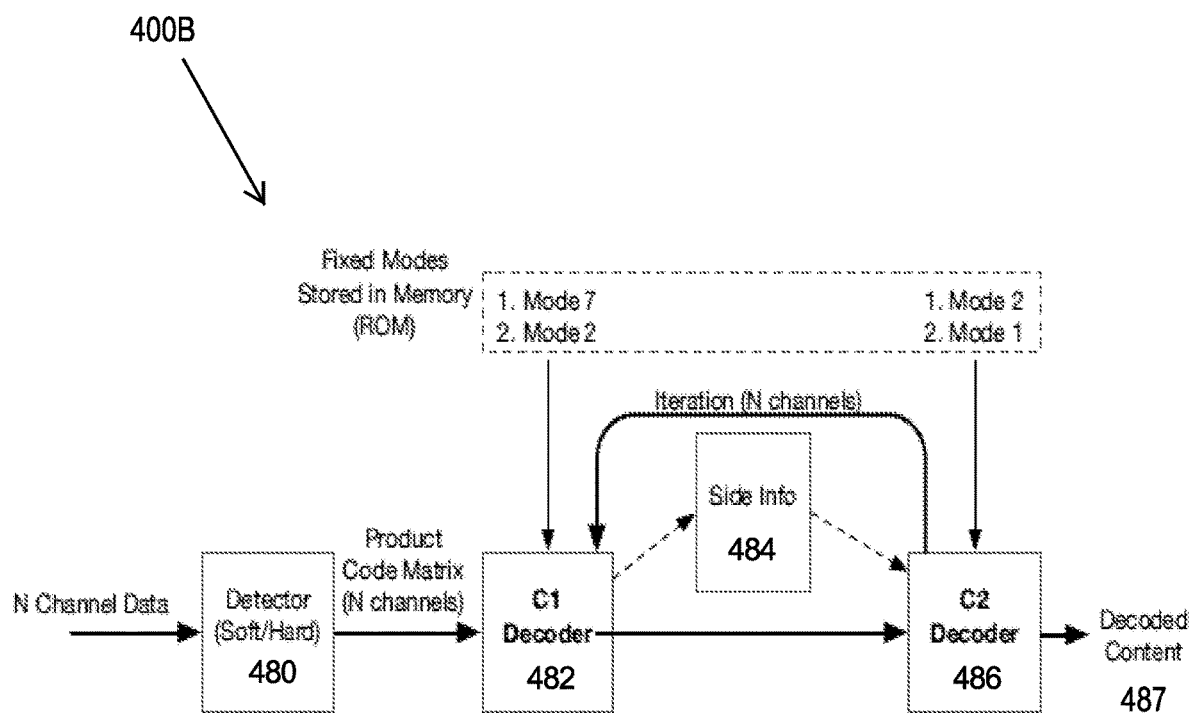
FIG. 4B illustrates one embodiment of an iterative product decoding system.

FIG. 4B illustrates one embodiment of an iterative product decoding system 400B. The improved read channel of LTO starts from the detector 480 and the following ECC blocks, the C1 decoder 482 and the C2 decoder 486, to again provide decoded content 487. The bold arrows represent the data path where the data flows through the pipeline. The dotted path is for the features that could be used by the decoders 482, 486 to select appropriate operational modes. In addition to the classical channel shown in FIG. 4A, this configuration allows the C1 decoder 482 and the C2 decoder 486 to iterate over the same data block to enhance decoding accuracy. In this case, different modes of operation can be chosen by the decoders 482, 486. In one embodiment, these operational modes are preselected and written on a ROM or an equivalent memory device inside the hardware. As the iterations continue, the appropriate pair of operational modes are selected by the decoders 482, 486 as they attempt data reconstruction. Iterations may continue until the data is reconstructed without error or a predetermined number of iterations are reached. In one embodiment, side information 484 from the C1 decoder 482 may be used to select the operational mode of the C2 decoder 486.

Figure 4C:
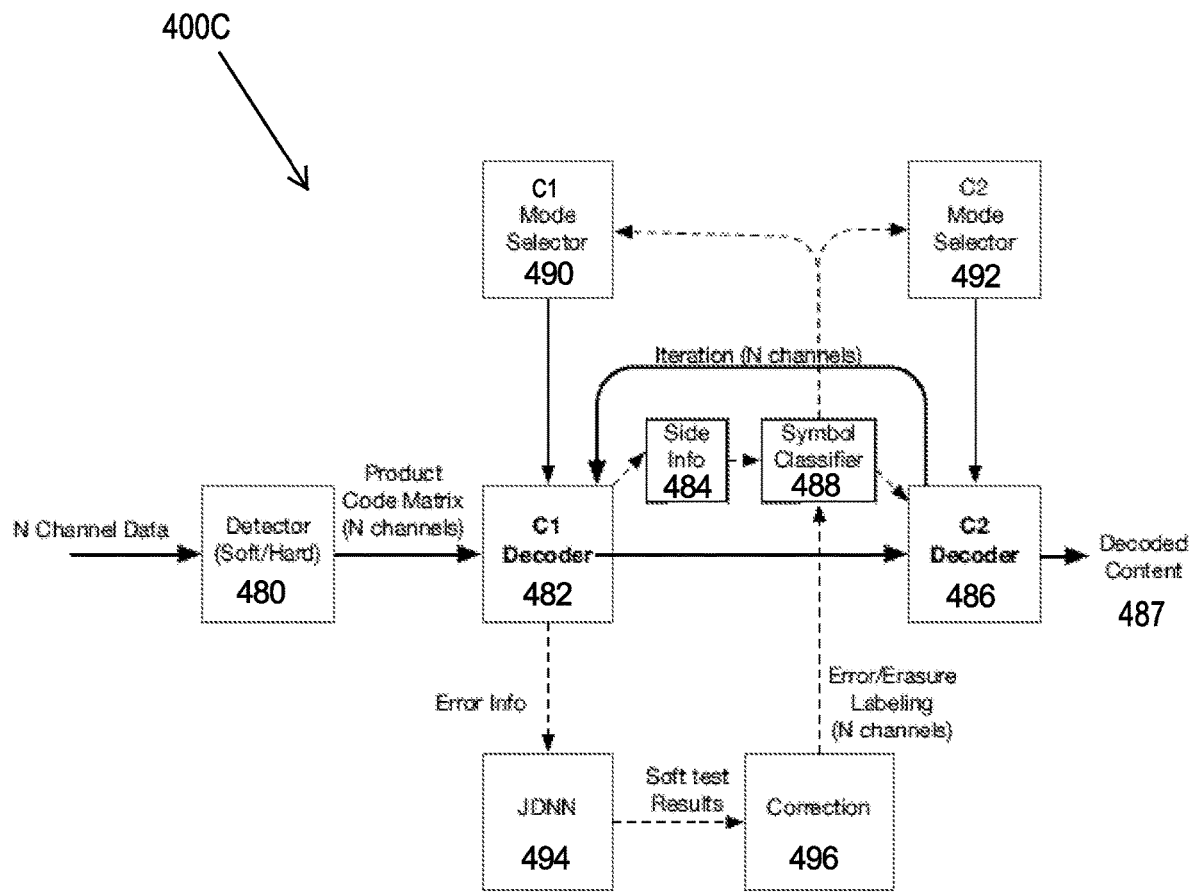
FIG. 4C illustrates one embodiment of the AI-augmented iterative product decoding system with a dumb start.

FIG. 4C illustrates one embodiment of the AI-augmented iterative product decoding system 400C with a dumb start. The improved read channel of LTO starts from the detector 480 and the following ECC blocks, the C1 decoder 482 and the C2 decoder 486, to again provide decoded content 487. As noted above, in certain embodiments, the AI-augmented iterative product decoding system 400C can additionally and/or alternatively utilize another suitable type of decoder such as a C3 decoder.

However, in this configuration, in addition to iteration, the system 400C uses an artificial intelligence system, in one embodiment a joint deep neural network (JDNN) 494.

Again, the bold arrows represent the data path where the data flows through the pipeline. The dotted path is for the features that could be used by the decoders 482, 486 to select appropriate operational modes.

As can be seen the feature path includes, in addition to side information 484 such as described above, JDNN 494, correction 496, and symbol classifier 488. The joint deep neural network (JDNN) 494 is run to feed correction 496 and symbol classifier 488 blocks to determine the best modes of operation of the decoders 482, 486 for each iteration of the system 400C. For example, in one non-exclusive embodiment, the system 400C can further include a C1 mode selector 490 and a C2 mode selector 492, which each receive information from the symbol classifier 488 for purposes of selecting the appropriate operational modes for the C1 decoder 482 and the C2 decoder 486, respectively. As illustrated, the JDNN 494 receives error information data from the C1 decoder 482.

In one embodiment, the Joint DNN 494 provides soft test results to the correction block 496. Soft test result data provided by the JDNN 494 can be a set of (potentially floating) values. In order to calculate the probabilities of the symbol being error/erasure/correct symbol, the correction block 496 processes the values from the JDNN 494 (based on the precision, and previous iteration results). In one embodiment, the correction block 496 translates the values from the JDNN 494 through a softmax layer (or similar) to a set of probabilities. These probabilities are forwarded to the symbol classifier 488 which makes the final classifications based on a set of threshold values. In one embodiment, these threshold values are adaptively selected by the symbol classifier 488. This way, modes of operation are selected based on the channel conditions and error patterns and secure either (1) better accuracy for a given maximum number of iterations and/or (2) better convergence rate given the number of iterations can be made arbitrarily large.

Figure 4D:
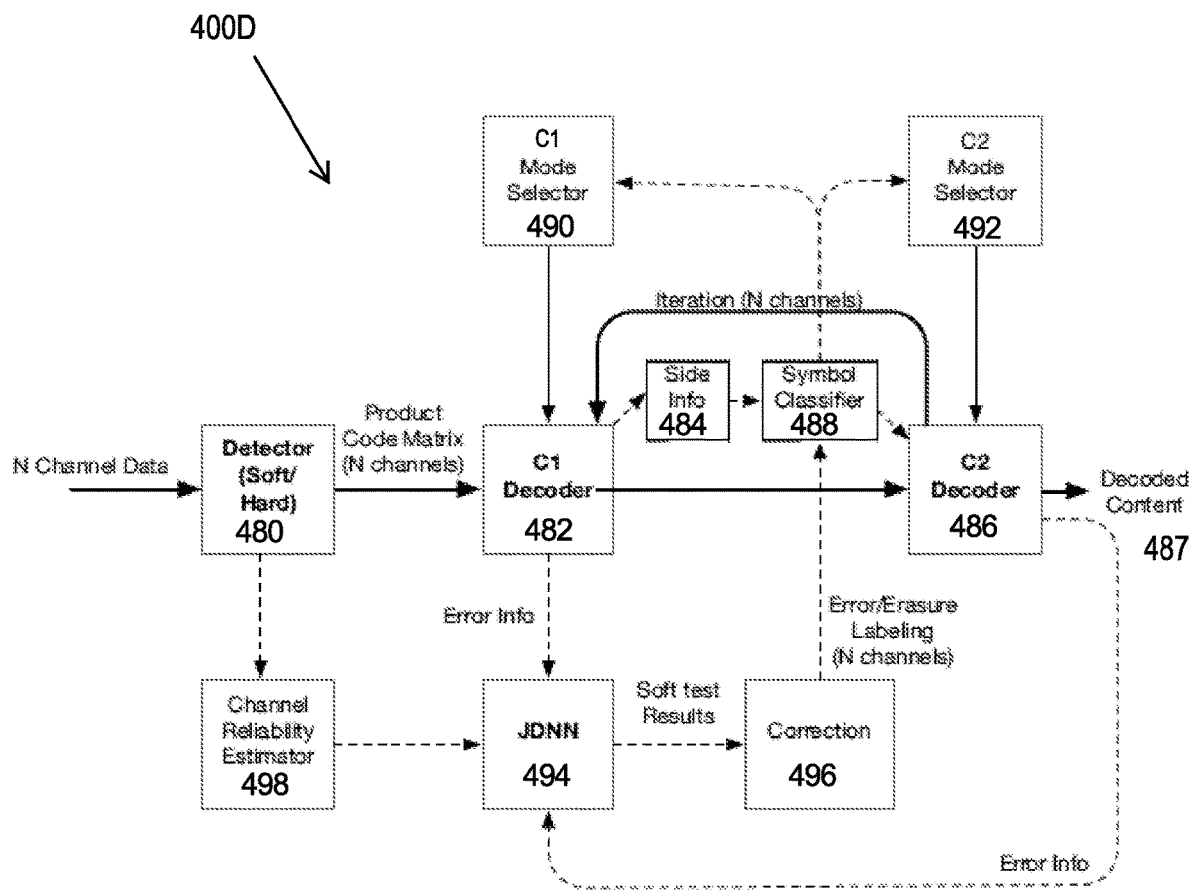
FIG. 4D illustrates one embodiment of the AI-augmented iterative product decoding system with a guided start.

FIG. 4D illustrates one embodiment of the AI-augmented iterative product decoding system 400D with a guided start. This extended version of the read channel of LTO starts from the detector 480 and the following ECC blocks, the C1 decoder 482 and the C2 decoder 486, to again provide decoded content 487. As noted above, in certain embodiments, the AI-augmented iterative product decoding system 400D can additionally and/or alternatively utilize another suitable type of decoder such as a C3 decoder.

The bold arrows represent the data path where the data flows through the pipeline. The dashed path is for the features that could be used by the decoders 482, 486 to select appropriate operational modes.

This is an extension of the AI-augmented iterative system 400C described with respect to FIG. 4C, adding a guided start. As can be seen the feature path again includes the side information 484, the JDNN 494, the correction 496, the symbol classifier 488, the C1 mode selector 490, and the C2 mode selector 492.

One addition in this model is that the output of error information from the C2 decoder 486 also provides information to the JDNN 494. Such a setting helps the JDNN 494 train better in an online setting and increase the accuracy of labelling by the symbol classifier 488. A second addition in this model entails the JDNN 494 receiving channel reliability information via a channel reliability estimator 498 based on output data from the detector 480.

Data from the C1 decoder 482 and the C2 decoder 486 thus both feed the JDNN 494 with error information for better training and hence leads to lower latency and/or increased accuracy of results.

The channel reliability estimator 498 receives information that is prepared by the detector 480, based on the channel input and the detector algorithm. The channel reliability estimator 498 determines the channel reliability metrics based on noise and inter-symbol interference characteristics. This can be used as additional information by the JDNN 494 in the online training phase. In some embodiments, the channel reliability estimator 498 may also be used for transfer learning.

The JDNN 494 is usually pretrained before operation. However, channel reliability is time-varying and different channels may have different error characteristics. There are also other mechanical ingredients of the channel that would benefit from adaptation enhancements. Thus, the JDNN 494 could be retrained, on top of the pretraining provided prior to the receiving the first data set to evaluate. The retraining may use data from the channel reliability estimator 498. In one embodiment, in the first iteration of the decoding, there are no inputs from the C1 decoder 482 and the C2 decoder 486. Thus, the channel reliability information input from the channel reliability estimator 498 is useful to start the JDNN 494 in a good search space, which can reduce the number of iterations needed for the level of required accuracy. This scheme may be referred to as a double-guided start for the JDNN 494, because the JDNN 494 is guided both by the channel reliability information from the channel reliability estimator 498 and error information from both the C1 decoder 482 and the C2 decoder 486.

The AI-augmented iterative decoders illustrated in FIGS. 4C and 4D include a C1 decoder 482 and a C2 decoder 486. In one embodiment, the C1 decoder 482 can be run in Mode $\lfloor (n_1-k_1)/2 \rfloor +1$ all times, whereas the mode of the C2 decoder 486 is selected based on side information 484 provided by the C1 decoder 482 and the data from the JDNN 494 (or other artificial intelligence system) which is trained based on a training data assuming a specific channel model. Final classification of symbols is done by the classifier 488 based on these two distinct outputs. Finally, an operational mode for the C2 decoder 486 is selected by the C2 mode selector 492. In one embodiment, the C2 mode selector 492 receives data from the symbol classifier 488. Thus, the C2 mode selector 492 selects the mode for the C2 decoder 486 based on the feedback data. For instance, if the misclassification ratio is close to 0, the C2 decoder 486 can run in Mode 1. If the ratio is higher, the mode can be selected to be 2, 3, etc. depending on the severity of the misclassification ratio.

In one embodiment, the classification of symbols is accomplished using the result of the C1 decoder 482 and the JDNN 494.

If the C1 decoder 482 successfully decodes, and probability values based on the data from JDNN 494 and analysis by correction block 496 only indicates one or two errors, this can lead to miscorrection. If the C1 decoder 482 successfully decodes and the JDNN 494 and the correction block 496 indicates no error or erasure, this indicates correct decoding. If the C1 decoder 482 fails, then the system directly uses the JDNN 494 result to label the symbols as erasure.

In one embodiment, the decoding decision is made based on the results of the symbol classification 488. If the number of symbols labeled as erasure are below the erasure correction capability of the C2 decoder 486, then the system examines the misclassification ratio. If it is high, the system reserves guard bytes (1 or 2 or more) and the remaining redundancy is used for erasure corrections. This implies that the system selects Mode 2, Mode 3, or higher modes depending on the classification ratio, based on the training data and the network used for classification. If the misclassification ratio is low or close to 0, the system selects Mode 1.

After determining the mode of operation, the C2 decoder 496 is executed. Then, the second iteration is initiated. In one embodiment, the iteration index is incremented. In one embodiment, the iteration index is an input to the JDNN 494. The system attempts to correct the remaining errors of the previous iteration by the C1 decoder 482, using error-correction mode. In one embodiment, the side information 484 from the C2 decoder 486 is deliberately ignored to limit any potential error propagation between iterations. The remaining process continues the same way except this time the JDNN 494 output for iteration 2 is used in the symbol classification process.

Other machine-learning schemes can also be used with this schema, as long as the machine-learning scheme can perform multi-class classification. One such exemplary learning scheme is Error Correction Output Coding (ECOC) frameworks in which multiple component binary classifiers are used with an appropriate merging algorithm to achieve successful multi-class classification. In one embodiment, any multi-class (4-class) classification algorithm can be used to classify bytes in each iteration into one of the four classes A, B, C, D. Accuracy and independence of such algorithms is of crucial importance for the iterations to work properly and in order not to introduce new types of errors into the decoding operation. Depending on the technique, the training may take different amount of time and memory space.

In the proposed iterative decoding scheme, the decoders 482, 486 pass information to each other to fully utilize the potential of each decoder 482, 486 using the low-complexity BM algorithm, such as operating in Mode 1 for all component codes except the first C1. In one embodiment, the objective is to use the following sequence of decodings where an iteration is defined to comprise C1 and C2 decodings (C1 decoding is the first half (FH) and C2 decoding is the second half (SH) of the entire iteration):

| $1^{st}$ Iteration (FH) | $1^{st}$ Iter(SH) | $2^{nd}$ Iter(FH) | $2^{nd}$ Iter(SH) |
|---|---|---|---|
| C1 (Mode $\lfloor (n_1 - k_1)/2 \rfloor + 1$) | C2 (Mode 1) | C1 (Mode 1) | C2 (Mode 1) | . . . | where for C1 (x) or C2(x), x is the mode of operation. However, due to miscorrections, the decoders may prefer other modes over Mode 1 in order not to corrupt data while recovering it. These modes may be selected upon the reliable detection of errors from the previous decoding stage.

In one embodiment the following side information (SI) is provided for each component code decoding:

SI 1. Previous decoding provides erasure label set for the i-th iteration $I_E(i)=\{A,B\}$. This information is combined (union) with $\{C\}$ before being passed to the next decoding stage.

SI 2. Soft-schemes or associated machine-learning schemes (such as deep forward neural networks) correct side information by eliminating/minimizing $\{B, C\}$ in $I_E(i) \cup \{C\}$ as much as possible and prepare a $\hat{I}_E(i)=I_E(i+1)$.

In one embodiment, the (i+1)-th stage of iteration uses the modified side information $\hat{I}_E(i)$ and chooses the best decoding mode if $2t+e \leq n-k$ is satisfied. Otherwise, in one embodiment, no decoding is attempted to reduce the cases pertaining to C (unlabeled errors) and it is used to generate the new side information for the next iteration.

After the identification of the mode, the BM algorithm is applied with the appropriate mode to complete the decoding of data bytes. In case no decoding is attempted, the mistakes (wrong decisions) made by the corresponding iteration of the proposed scheme will propagate to the next decoding iteration, thus contributing to Class B and C. As can be seen, the key step is the accuracy of the side information provided by SI 2, since it is not only helping with C but also with B which is the inaccuracy introduced by SI 1 i.e., correction of misinformation provided by SI 1.

Figure 5:
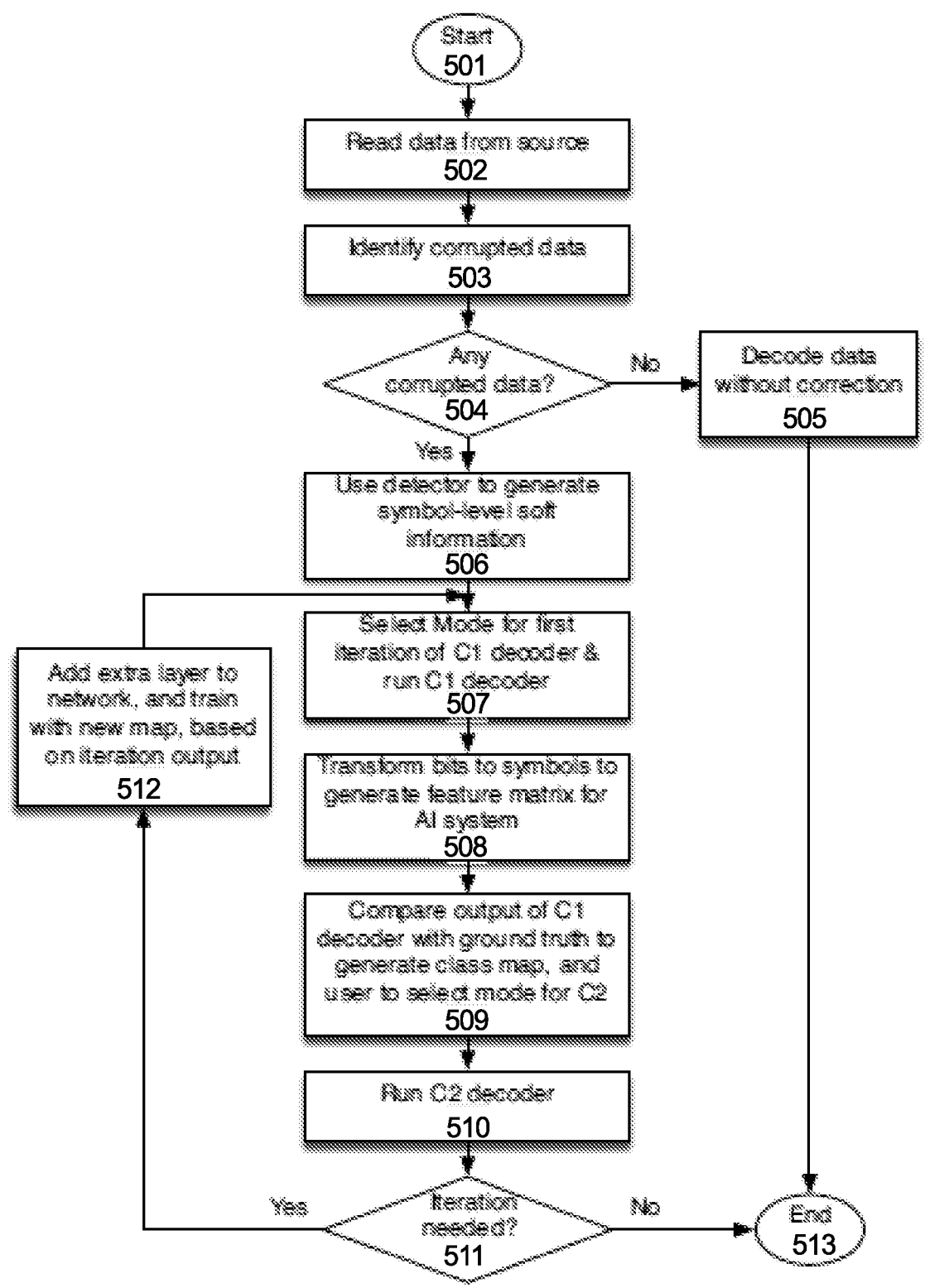
FIG. 5 is a flowchart of one embodiment of a typical read scenario.

FIG. 5 is a flowchart of one embodiment of a typical read scenario. The process starts at block 501. The data is initially read from data source, at block 502. At block 503, a data detection method is used to identify corrupted digital data before running the product decoding. In one embodiment, this module is also operated in hard-decision mode (typically at the bit level) as it allows extremely low complexity optimal detection based on maximum likelihood estimation.

At decision block 504, a question is posed as to whether or not any corrupted digital data has been identified. If the answer is no, then the process proceeds to block 505 where the data is decoded without correction. Once the data is decoded without correction, then the process is ended at block 513.

However, if the answer to the question posed at decision block 504 is yes, that there is corrupted digital data, then the process proceeds to block 506. In particular, to help with the identification of classes B and C, as described above, in one embodiment at block 506 symbol-level soft information is generated by the detector. Soft-out algorithms output the probabilities for each potential value, rather than a hard decision. Various soft-out algorithms may be used. Thus, techniques like Soft-output Viterbi Algorithm (SOVA), or more discrete version of it, such as List-Viterbi type detectors, can be used to generate reliability information (such as log-likelihood ratios) on the bytes of the component codes.

Subsequently, at block 507, an operational mode is selected for the first iteration of the C1 decoder and the C1 decoder is run in that mode.

In one embodiment, when soft-out techniques are used, at block 507, the first round (or iteration) of the C1 decoder is run in Mode 1. Of course, this reliability information evolves as the system runs C1 and C2 decoders (and iterations by the same rationale) which would utilize C1 and C2 decoders on the soft-out mode also. However, a soft-out choice would make the system run in complete soft-out mode and would make it very complex to implement overall, because these systems provide reliability information (subject to a precision constraint) rather than a hard decision on the final possible set of symbols. For instance, instead of reporting "0" or "1", these detectors report the probabilities such as [0.8 0.2] for seeing "0" and "1", or corresponding log-likelihood ratios, respectively. This can be extended to more than two symbol case. These detector structures require more complex implementation and better precision hardware.

It is also useful to specify the degree of softness of the shared data between component code decodings. When it is implemented in digital hardware, precision becomes the main performance limiter. To gain an observable performance boost, a multiple orders of magnitude enhancement might be needed in the required memory and silicon chip die area. All in all, the digital hardware precision would limit the performance offered by soft schemes, thus making it a less attractive choice.

The machine-learning methods learn the error characterization of the decoders using a given data storage channel for each iteration from the data storage channel detector output. In other words, information about what can be decoded or what would cause an error or miscorrection is identified and learned. Thus, in one embodiment, machine-learning/deep-learning schemes are used to understand the error patterns that are problematic. Once such error patterns are identified, they are used in setting the best decoding strategy.

The output of the detector is typically binary ML (maximum likelihood) sequence estimation of the data bits stored. In one embodiment, the ML detection is preferred because there are low complexity implementations of such decoders and ML provides optimal detection performance with uniform prior distributions. In one embodiment, trellis decoding based architectures are used.

At block 508, the detected bits are transformed to corresponding symbols. A block of $n_1 \times n_2$ symbols are used as the feature matrix input to an AI system (in one embodiment a feed-forward deep neural network).

Figures 6A, 6B:
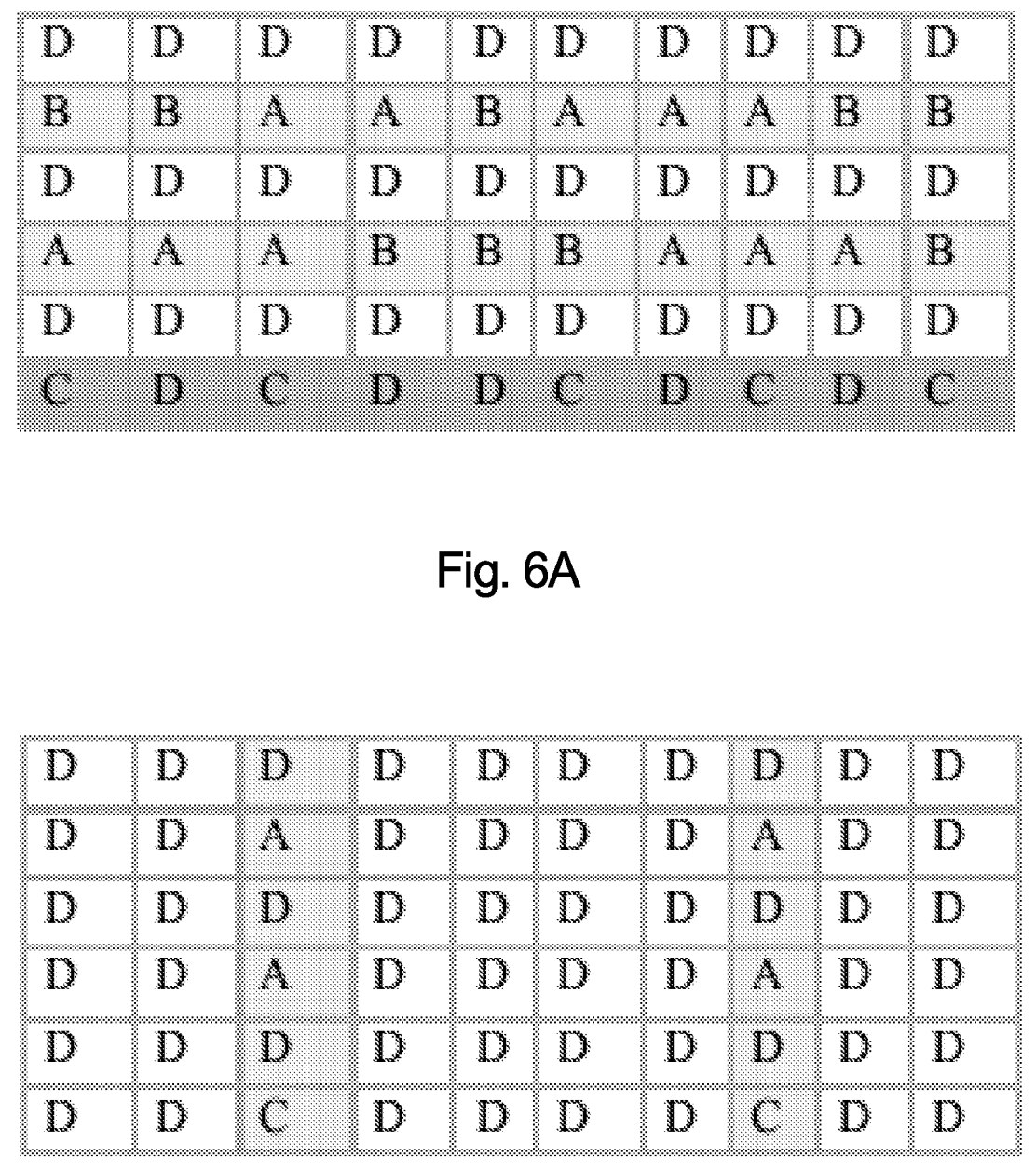

In one embodiment, an AI block (such as a joint neural network) is provided with the output of a set of valid product codewords (called ground truths) that are put through a channel (such as simple symmetric discrete memoryless channels). As noted above, the C1 decoder is run, at block 507. In one embodiment, the operational mode of the C1 decoder is selected based on data from the AI block. In one embodiment, more complicated channel models can be run-simulated as well. The output of the C1 decoder is compared with the ground truth to generate a 4-class map, at block 509, and the user selects the operational mode for the C2 decoder. Example 4-class maps for (10,7) C1 and (6,4) C2 codes are shown in FIG. 6A for the first iteration, first half, and in FIG. 6B for the first iteration, second half.

A machine-learning or, more specifically, a deep-learning method is trained to find an appropriate function based on the training data between the input (C1 and C2 encoded $n_1 \times n_2$ message symbols) and the 4-class map that is the output of the C1 decoding after the channel (first iteration). In one embodiment, multiple ($n_2$) joint neural networks can be used to generate the 4-class maps for each C1 codeword after decoding. Once this map is accurately estimated, then the mode index of the C2 decoder may be decreased.

At block 510, the C2 decoder is run. In one embodiment, the C2 decoder may be run in Model, at block 510.

Subsequently, the process determines if additional iterations are needed, at block 511. If the answer is no, that no additional iterations are needed, then the process ends at block 513.

However, if the answer is yes, that additional iteration(s) are needed, for the next iteration, at block 512, since the ground truth is known, an extra (hidden) layer is added to the network and trained with the new map that takes into account the second iteration output.

The example of FIG. 6A is extended to encompass the second half of the iteration in FIG. 6B. As can be seen, in an ideal case, only two columns would not be decoded correctly even if the C2 decoder is operated in Mode 1. This new map is shared with the next iteration of C1 decoding if any. In that case, the C1 decoder will also operate in Mode 1 and be able to correct the remaining errors (since the number of erasures are 2<3 in the provided example).

Other iterations of the product decoding proceed the same way, repeating steps 507-511 as needed. In one embodiment, if one of the iterations ends up correcting all errors the system does not add an extra layer for the neural network, as it does not need to predict errors/erasures anymore. Since different error patterns may require different number of iterations to reach to successful decoding stage, in one embodiment for a given operating point, the system chooses the best case to determine the total number of iterations and hence the total number of layers in the neural network. A ballpark number can be selected in advance as well, in one embodiment.

Figure 7:
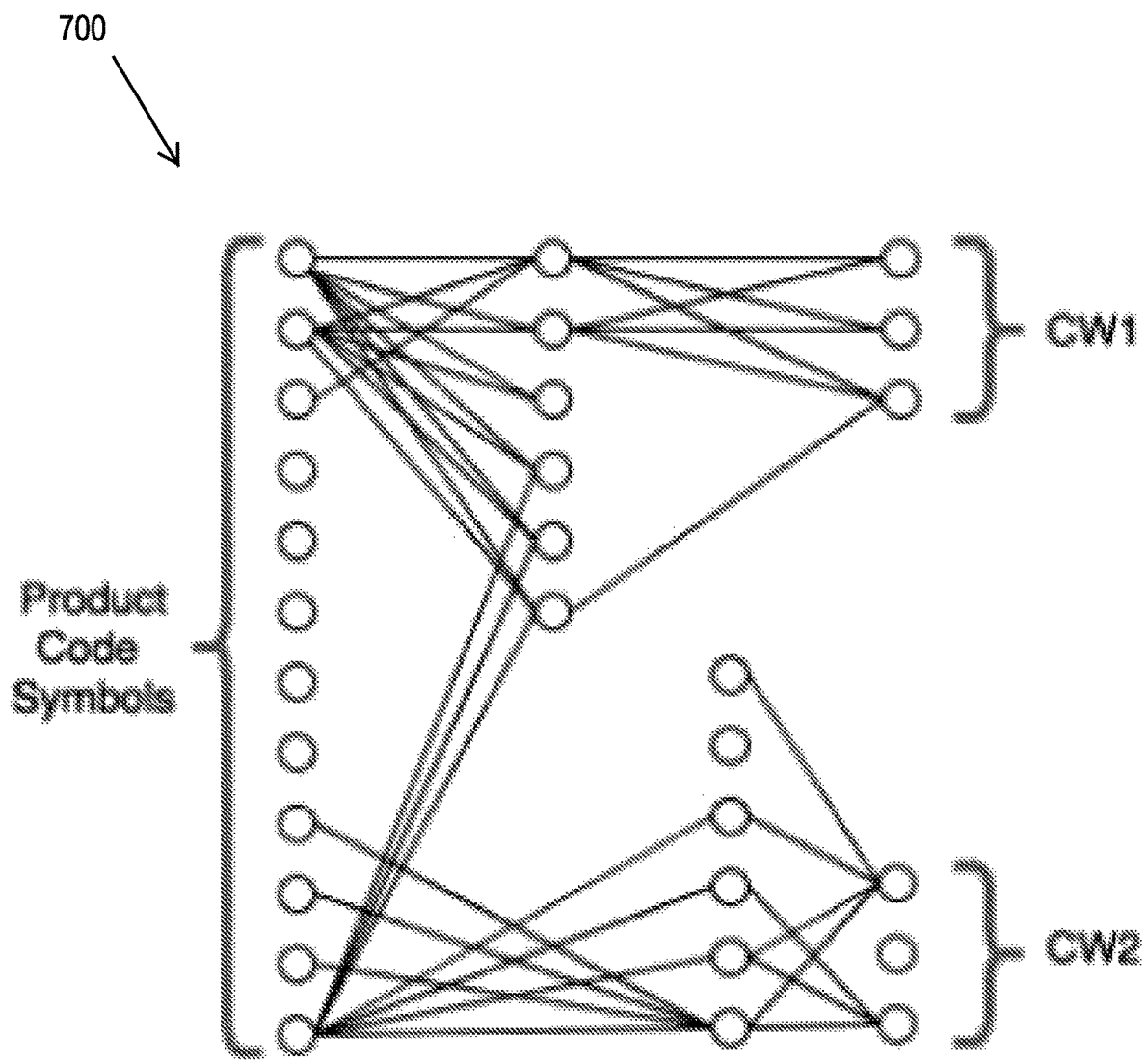
FIG. 7 illustrates one embodiment of a joint neural network which may be used with the present invention.

In an embodiment, a joint neural network can be used to classify the bytes of two C1 codewords (indicated as CW1 and CW2 with $n_2=2$). FIG. 7 illustrates one embodiment of a joint neural network 700 which may be used with the present application. In one embodiment, a softmax function output layer is used to map the last layer values to a value between 0 and 1. In one embodiment, scaling is used for this mapping. A softmax function takes as input a vector z of K real numbers and normalizes it into a probability distribution consisting of K probabilities, with each of the components in the interval [0,1] and the components adding up to one.

An example of this approach is discussed below using an exemplary four classes X, Y, Z, T classes to be separated. One of skill in the art would understand that this is a simplification to explain the approach. These four classes are divided into three superclasses S1, S2, S3, where each superclass can contain more than one base class (X, Y, Z or T). Let 0 indicate Superclass S1 and 1 indicate Superclass S3. The threshold to separate S1 and S2 can be set to 0.25 and the threshold to separate S2 and S3 can be set to 0.75 with the default setting, for example. These superset formations as well as the associated thresholds can be adaptively selected to improve classification performance based on the available training data.

In one embodiment, cross-validation techniques can be used to optimize the threshold values based on the available simulated data. Thus, in this example, using the exemplary default setting, there are three regions where [0, 0.25] is for superclass S1, [0.25, 0.75] is for superclass S2, and [0.75, 1] is for superclass S3. This mapping is specifically created to maximize the separation between superclass S1 and S3 which are selected to pose the most difficult separation.

FIG. 8 provides a table with a summary of all potential cases for misclassification, in one embodiment. The table also includes the potential implication and the outcome of the corresponding misclassification result. Based on the table, to minimize the number of guard bytes, the system can select S1={A}, 52={C} and S3={B,D}. To minimize the waste of C2 correction power, the system can select S1={D}, S2={B}, S3={A,C}. Based on this observation, it is sufficient to design binary classifiers that can differentiate between classes {A,C} and {B,D}.

Figure 9:
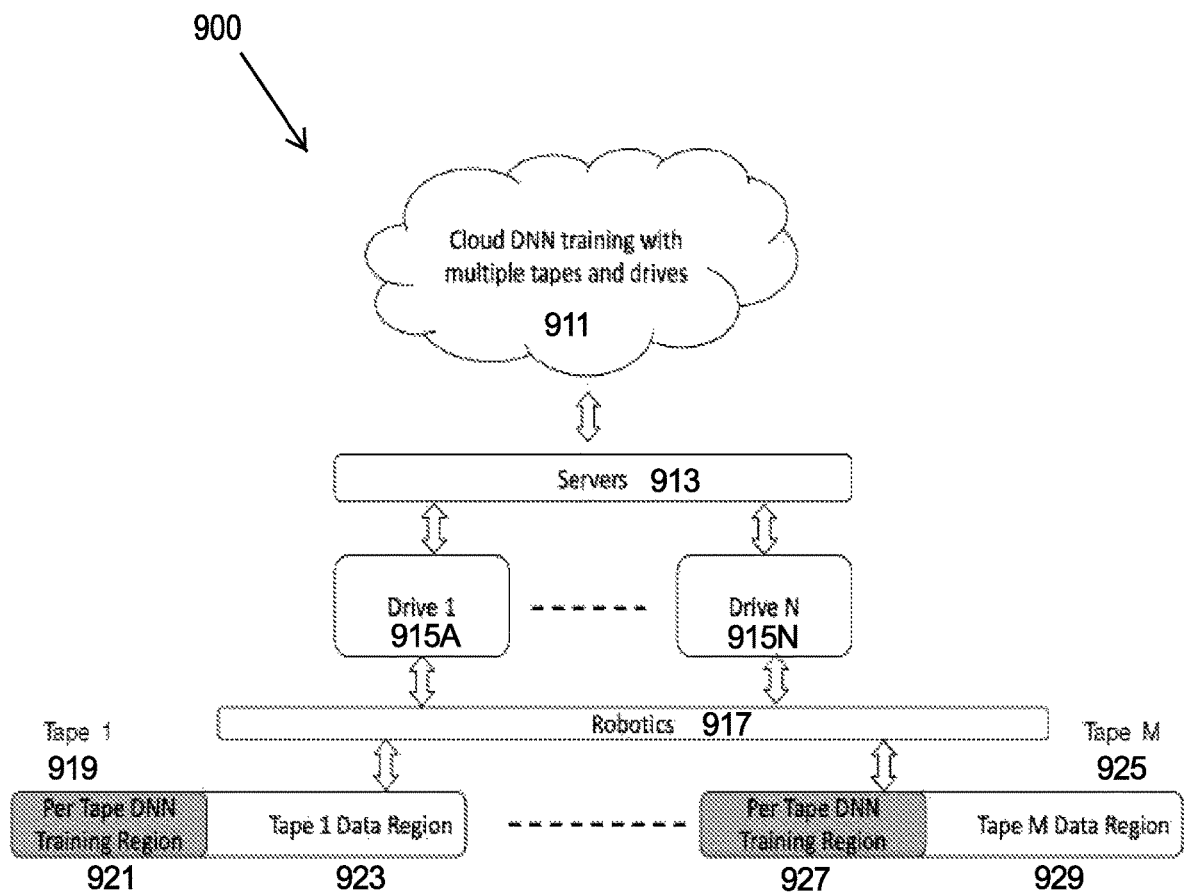
FIG. 9 is one embodiment of an environment for training the neural network.

FIG. 9 is one embodiment of an environment 900 for training the neural network. As illustrated, in one non-exclusive embodiment, the present invention can utilize a cloud-based learning system environment that feeds into the drives for purposes of training the neural network.

As shown in FIG. 9, servers 913 can be configured to control one or more drives 915A, 915N. Robotics 917 move tapes 919, 925 to and from the drives 915A, 915N. One or more of the tapes 919, 925 may include per tape deep neural network (DNN) training regions 921, 927, in addition to corresponding data regions 923, 929.

In one embodiment, the system and/or environment 900 provides global and per-tape training of the DNN. In one embodiment, cloud-based 911 DNN training with multiple tapes and drives receives per-tape training data gathered from the drives 915A, 915N, and uses it to further optimize the training. In one embodiment, each tape 919, 925 includes the corresponding per-tape DNN training region 921, 927, respectively, as well as the corresponding data region 923, 929, respectively. In one embodiment, the error pattern data is written by the same drive as the user data. In one embodiment, local per-tape training is used with the drives 915A, 915N to train the DNN to identify an optimized starting point per tape 919, 925. In one embodiment, specific base sequences can be synthesized and sequenced to allow per-molecule training in a DNA storage scenario to effectively adapt to changing conditions.

In one embodiment, the cloud 911 stores data aggregation and error patterns, rather than actual error data, to ensure that user data remains confidential. However, the per-tape DNN training region 921, 927 can provide training and analysis data, without violating confidentiality. In one embodiment, this system provides federated learning, in which the system shares parameters but not data with the cloud 911. In one embodiment, the deep neural network receives aggregated parameters back from the cloud 911 and is trained in an iterative fashion. Thus, simply stated, the cloud 911 is configured to (i) collect data from the drives 915A, 915N, (ii) consolidate the data, (iii) learn from the consolidated data, and (iv) distribute the consolidated data, and the knowledge learned therefrom, back to the drives 915A, 915N. As illustrated, the data can be communicated to and from the cloud 911 and the drives 915A, 915N via the servers 913. Additionally, or in the alternative, the data can be communicated to and from the cloud 911 and the drives 915A, 915N via host applications 2 (illustrated in FIG. 1) and/or the data storage system (such as the tape library 10 (illustrated in FIG. 1) and/or the library control system 30 (illustrated in FIG. 1) included therein).

In certain implementations, the host application 2 can provide a current model of the artificial intelligence augmented iterative product decoding system to a tape drive, a solid-state drive (or other suitable data storage system), and the model can then be regularly updated through continued use to further improve overall performance.

Figure 10:
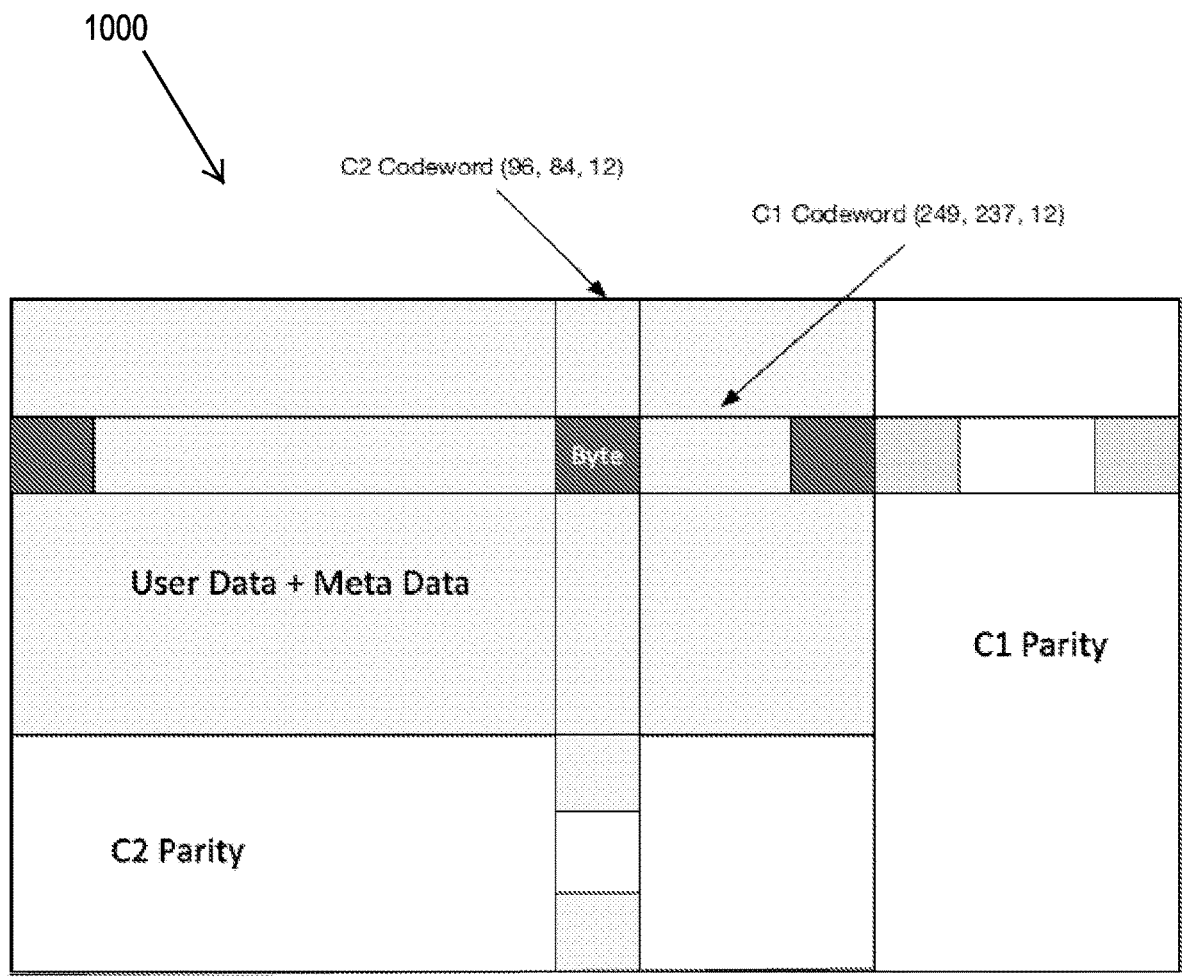
FIG. 10 illustrates exemplary data, showing user data and metadata information.

FIG. 10 illustrates a chart 1000 of exemplary data, showing user data and metadata information. This is merely an exemplary configuration.

When user data is sent to the tape drive, in one embodiment, the system takes the user data, breaks the user data into fixed chunks, and splits each across 237 column cells. It then takes each of 96 rows, and uses Reed-Solomon (RS) codes. In one embodiment, 12 additional parities are added for each of the 96 rows. This results in a 12-column by 96-row data format. The data channel has rows of 32 channels (each channel has 3 rows), in one embodiment. In one embodiment, after the initial decoding by the C1 decoder, the system may label an entire row "bad" if there are too many errors. This is the data passed to the C2 decoder. In one embodiment, the C1 decoder can pass more than just erasure data, as discussed above. In one embodiment, iteration happens because there are orthogonal C1 & C2 parity codes.

In one embodiment, user data with metadata is split into 237 bytes columns and 84 rows. Each column is encoded using 96, 84, 12 RS policy to generate 12 C2 parities with 237 columns. Once the C2 encode is complete, a formatter takes each 96 rows with 237 columns to generate 96 rows of 12 column C1 Parity data. This represents one embodiment of a C1-C2 RS (product) encoded data set. A typical decoder uses each row to detect errors and correct them using individual 96 rows of C1. After the first decode, the C2 will have data marked as either good data or erasures. In the initial phase, it may have a whole row marked as erasures if C1 fails to correct, even though some C1 bytes may be good. In one embodiment, each C2 codeword may see the same number of erasures.

Figure 11:
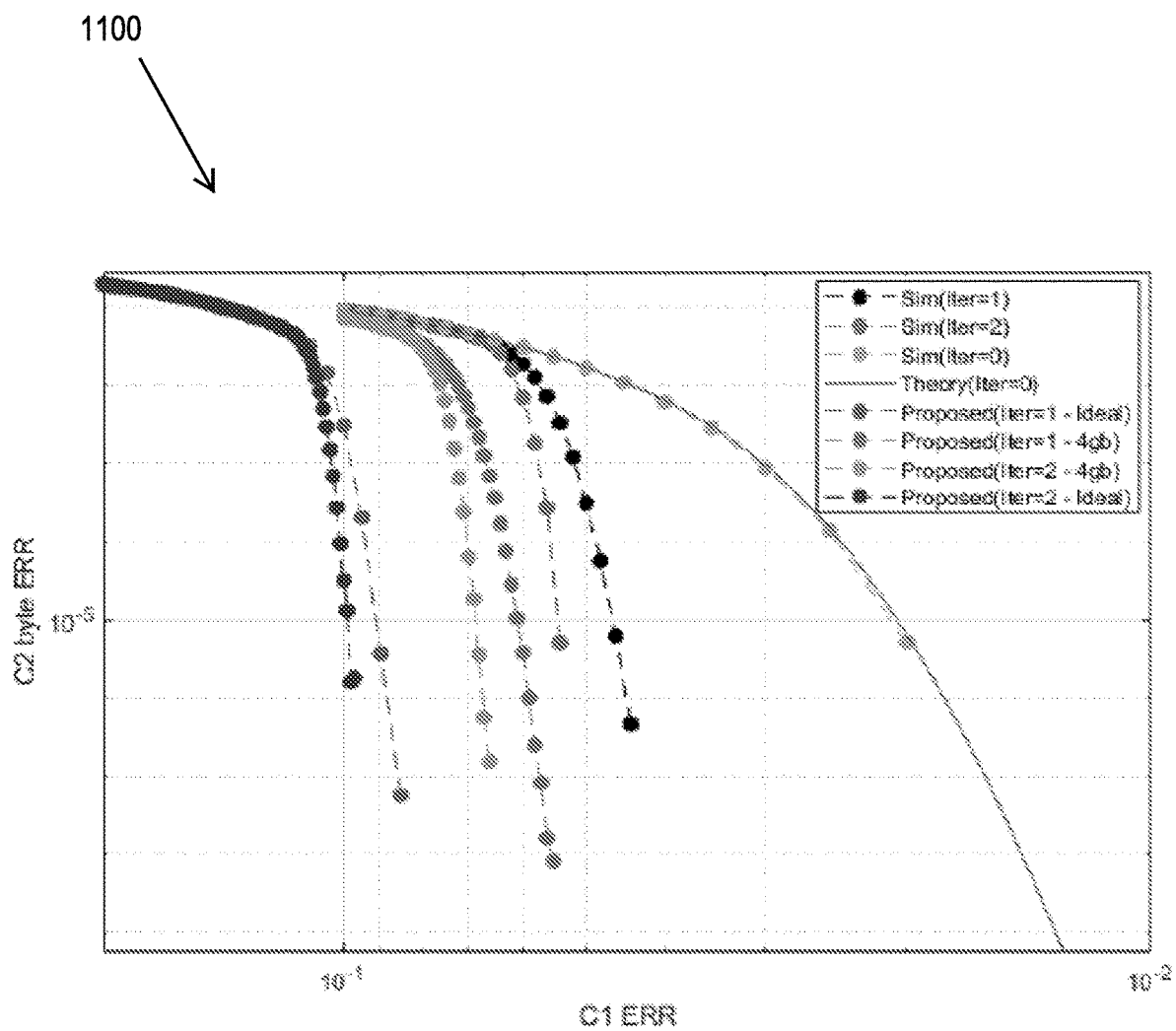
FIG. 11 illustrates results of a straightforward numerical simulation to support the use of an artificial intelligence augmented iterative decoder having features of the present invention.

FIG. 11 is a graphical illustration 1100 of results of a straightforward numerical simulation to support the use of this approach. FIG. 11 shows a plot of the performance (decoding failure probability) of the following systems as a function of C1 ERR (failure/error rate). For this simulation, (240,230) C1 and (96,84) C2 RS code was used.

Simulation (Iteration=1): C1-C2: One complete iteration of C1 and C2 decodings combined. The simulation is run to obtain the illustrated performance. All component codes are decoded in Mode 6—all error correction. In addition to the simulation result, the graph also illustrates a theoretical result which can be expressed in a closed form.

Simulation (Iteration=2): C1-C2-C1-C2: Two complete iterations of C1 and C2 decodings combined. The simulation was run to obtain the illustrated performance. All component codes are decoded in Mode 6—all error correction.

Simulation (Iteration=3): C1-C2-C1-C2-C1-C2: Three complete iterations of C1 and C2 decodings combined. The simulation was run to obtain the illustrated performance. All component codes are decoded in Mode 6—all error correction.

Proposed Approach (Iteration=2—Ideal): C1-C2-C1-C2: Two complete iterations of C1 and C2 combined where C1 decoder is run in Mode 6 whereas C2 decoder is run in Mode 1 due to (almost) perfect side information provided by the neural network.

Proposed (Iteration=2-4gb): C1-C2-C1-C2: Two complete iterations of C1 and C2 combined where C1 decoder is run in Mode 6 whereas C2 decoder is run in Mode 3 due to imperfect side information provided by the neural network. Here i is set to 3 (i=3), which means the system permits 3−1=2 errors and 96−84−4=8 erasures corrections by the C2 decoder. C2 is run in this Mode because the neural network can be trained to minimize the rate of Class B at the expense of increasing the rate of Class C. By allowing 4 guard bytes, the system addresses Class C events. As can be seen from the graph, as the C1 input error rate gets close to 10-1 and we increase the number of iterations, the C2 decoding failure rate gets close to zero, meaning that the probability of success becomes a near certainty.

Figure 12:
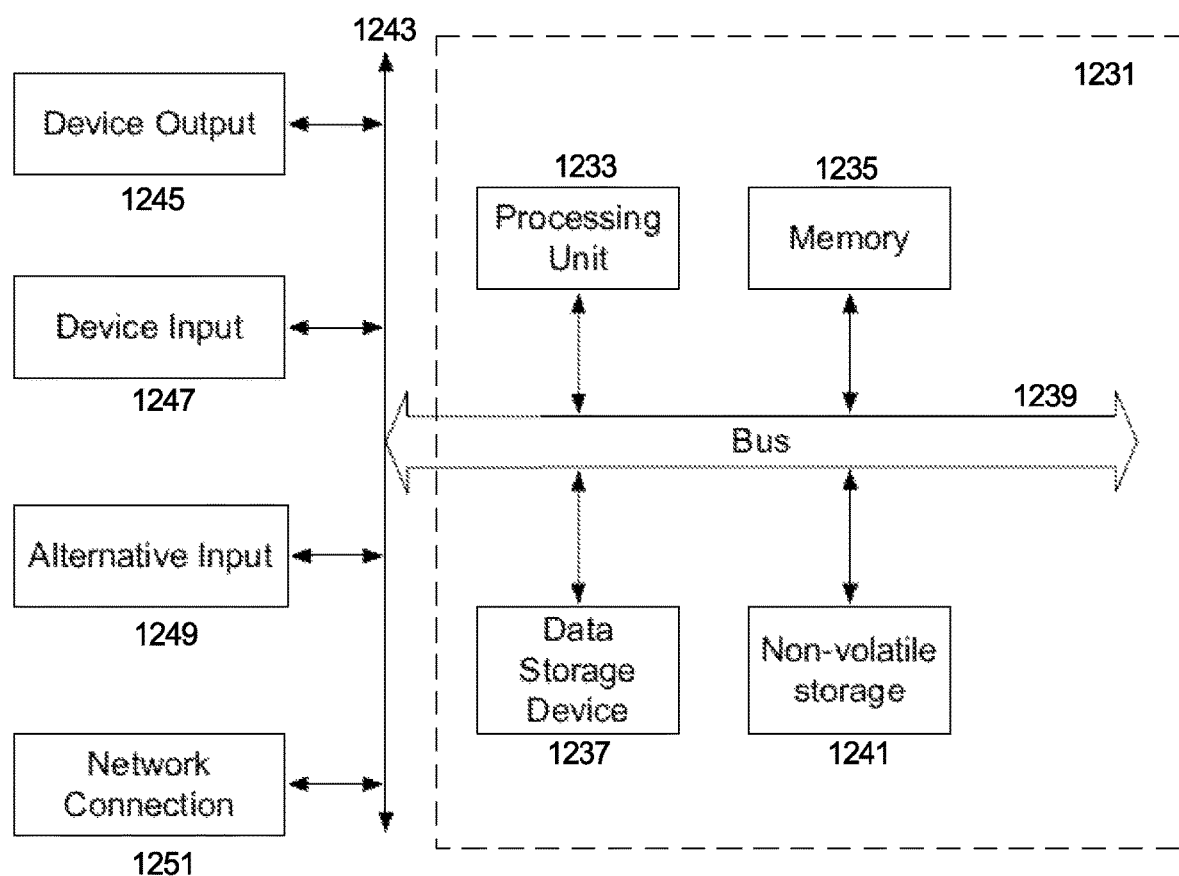
FIG. 12 is a block diagram of one embodiment of a computer system that may be used with the present invention.

FIG. 12 is a block diagram of one embodiment of a computer system 1231 that may be used with the present invention. It will be apparent to those of ordinary skill in the art, however that other alternative systems of various system architectures may also be used.

The data processing system illustrated in FIG. 12 includes a bus or other internal communication means 1239 for communicating information, and a processing unit 1233 coupled to the bus 1239 for processing information. The processing unit 1233 may be a central processing unit (CPU), a digital signal processor (DSP), or another type of processing unit.

The system 1231 further includes, in one embodiment, a random-access memory (RAM) or other volatile storage device 1235 (referred to as memory), coupled to the bus 1239 for storing information and instructions to be executed by the processor 1233. Main memory 1235 may also be used for storing temporary variables or other intermediate information during execution of instructions by the processing unit 1233.

The system 1231 also comprises in one embodiment a read only memory (ROM) or other non-volatile static storage device 1241 coupled to the bus 1040 for storing static information and instructions for the processing unit 1233. In one embodiment, the system 1231 also includes a data storage device 1237 such as a magnetic disk or optical disk and its corresponding disk drive, or Flash memory or other storage which is capable of storing data when no power is supplied to the system. The data storage device 1237 in one embodiment is coupled to the bus 1239 for storing information and instructions.

The system 1231 may further be coupled to an output device 1245, such as a cathode ray tube (CRT) or a liquid crystal display (LCD) coupled to the bus 1239 through bus 1243 for outputting information. The output device 1245 may be a visual output device, an audio output device, and/or tactile output device (e.g., vibrations, etc.)

An input device 1247 may be coupled to the bus 1243. The input device 1247 may be an alphanumeric input device, such as a keyboard including alphanumeric and other keys, for enabling a user to communicate information and command selections to processing unit 1233. An additional/alternative user input device 1249 may further be included. One such alternative user input device 1249 is a cursor control device, such as a mouse, a trackball, stylus, cursor direction keys, or touch screen, that may be coupled to the bus 1239 through the bus 1243 for communicating direction information and command selections to the processing unit 1233, and for controlling movement on output device 1245.

Another device, which may optionally be coupled to computer system 1231, is a network device 1251 for accessing other nodes of a distributed system via a network. The network device 1251 may include any of a number of commercially available networking peripheral devices such as those used for coupling to an Ethernet, token ring, Internet, or wide area network, personal area network, wireless network, or other method of accessing other devices. The network device 1251 may further be a null-modem connection, or any other mechanism that provides connectivity between the computer system 1231 and the outside world.

Note that any or all of the components of this system 1231 illustrated in FIG. 12 and associated hardware may be used in various embodiments of the present invention.

It will be appreciated by those of ordinary skill in the art that the particular machine that embodies the present invention may be configured in various ways according to the particular implementation. The control logic or software implementing the present invention can be stored in the main memory 1235, the data storage device 1237, or other storage medium locally or remotely accessible to the processing unit 1233.

It will be apparent to those of ordinary skill in the art that the system, method, and process described herein can be implemented as software stored in the main memory 1235 or non-volatile storage 1241 and executed by the processing unit 1233. This control logic or software may also be resident on an article of manufacture comprising a computer readable medium having computer readable program code embodied therein and being readable by the data storage device 1237 and for causing the processing unit 1233 to operate in accordance with the methods and teachings herein.

The present invention may also be embodied in a handheld or portable device containing a subset of the computer hardware components described above. For example, the handheld device may be configured to contain only the bus 1239, the processing unit 1233, and the main memory 1235 and/or non-volatile storage 1241.

The handheld device may be configured to include a set of buttons or input signaling components with which a user may select from a set of available options. These could be considered input device #1 1247 or input device #2 1249. The handheld device may also be configured to include an output device 1245 such as a liquid crystal display (LCD) or display element matrix for displaying information to a user of the handheld device. Conventional methods may be used to implement such a handheld device. The implementation of the present invention for such a device would be apparent to one of ordinary skill in the art given the disclosure of the present invention as provided herein.

The present invention may also be embodied in a special purpose appliance including a subset of the computer hardware components described above, such as a kiosk or a vehicle. For example, the appliance may include a processing unit 1233, a data storage device 1237, a bus 1239, and memory 1235, and no input/output mechanisms, or only rudimentary communications mechanisms, such as a small touch-screen that permits the user to communicate in a basic manner with the device. In general, the more special-purpose the device is, the fewer of the elements need be present for the device to function. In some devices, communications with the user may be through a touch-based screen, or similar mechanism. In one embodiment, the device may not provide any direct input/output signals, but may be configured and accessed through a website or other network-based connection through a network device 1251.

It will be appreciated by those of ordinary skill in the art that any configuration of the particular machine implemented as the computer system may be used according to the particular implementation. The control logic or software implementing the present invention can be stored on any machine-readable medium locally or remotely accessible to the processing unit 1233. A machine-readable medium includes any mechanism for storing information in a form readable by a machine (e.g., a computer). For example, a machine-readable medium includes read-only memory (ROM), random access memory (RAM), magnetic disk storage media, optical storage media, flash memory devices, or other storage media which may be used for temporary or permanent data storage. In one embodiment, the control logic may be implemented as transmittable data, such as electrical, optical, acoustical or other forms of propagated signals (such as carrier waves, infrared signals, digital signals, etc.).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

It is appreciated that almost all technical achievements come to real life due to an imminent engineering challenge or a difficulty in the implementation phase. The requirements typically elevate when connected with customer requests and operational human needs. Library systems are unique in that their design include mechanical and electronic components and are most influenced by different patterns of archiving needs. All elaborate hardware designs lead to sophisticated hardware interconnects, representational data descriptions using a complex format. One very important aspect of the complex design is the encoding and decoding processes of the raw data that is to be stored. In order to deal with the complexity of the design and meet the backward compatibility requirements, conventional technologies prefer to form modular structures which eventually leads to fixed design choices/decisions. As the relationship between humans and the data has evolved to a different level nowadays, conventional systems fall short of addressing the new requirements. More explicitly, the conventional design of the library systems combined with new usage patterns leads to unique technical challenges to which conventional technologies have failed to adequately respond.

As an overview, there are certain key components that are used in a unique way in this invention disclosure to address the aforementioned challenges. In particular, the key components can include one or more of learning error patterns, iterations, and mode selections based on causality.

With regard to learning error patterns, as most error patterns come with structure, the tape systems is not an exception. It can be shown that the correlating nature of events leads to product-code protection module experiencing various types of data loss due to decoding failures. A learning module, exposed to the decoding failures and/or detector outputs offline, wrapped around the existing hardware will be beneficial to make decisions on the selection of the right set of operational modes for C1-C2 decoding processes.

With regard to iterations, despite the fact that ECC decoding iterations is not new, the interactions of the learning module with an iterative decoder have to be designed carefully. The implementation of this logic includes circumventing many challenges such as adaptability, online learning, data access latency, complexity of the implementation, etc.

With regard to mode selections being based on causality, library systems/components age that noticeably happen over time. Therefore, a dynamic closed-loop learning process is required to maintain predictability. This loop has an expert group component which creates (interpretable) guidance for each iteration in the form of labeling information or computation of novel features. Note that expert's input is usually in causal format revealing the cause-effect relationships between distinct components of the decoding system. The model development utilizes only a constrained set of data space or feature space. The additional requirement of the model development (based on training) is to be interpretable. This would generate feedback for the expert group and potentially guide them for such a high dimensional complex data analysis task.

As noted above, conventional systems are unable to achieve the results of the present invention because conventional systems lack adaptation. In the best case, expert analysis could be done on the offline data. However, prevention mechanisms must be built-in to the system to be of any effect to precautionary maintenance. The assistive role of the learning module as disclosed in the present invention is being a wrapper with minimum change to the available and highly optimized decoding hardware.

Despite the understanding that data is typically structured (in the form error/erasure locations), it is appreciated that unstructured data (such as time series of detector input and output etc.) can also be used in the present system. Structured data is stored in databases in a digital format. Data access policies are generated through ownerships and customer's privacy is preserved. In case customers provide feedback, they provide it in the form of interpretation/model features not through sharing their own data. Additional hardware accelerator is used to guide online learning, RAM and secondary storage devices (hard drives) are used for storing the model and updates. A network card can be used to communicate local model or update the local model with parameters due to pretraining.

In summary, as illustrated and described in detail herein in various embodiments and Figures included herewith, implementation of the present invention typically requires one or more of the following:

(1) C1-C2 decoders (conventionally based on bounded distance decoding) that admit different modes of operation;
(2) A pretrained joint deep-neural network that iteratively refines (representational) learning through online input from different iterations of the decoders;
(3) A soft or hard-output detector to feed information for the deep neural network training;
(4) A correction module which generates and calibrates probabilities for the next decision-making module; and
(5) A classifier that makes a decision on the mode of operation based on the byte-level reliability information.

However, the artificial intelligence augmented iterative product decoding system of the present invention functions most effectively when any or all such technical features are combined in a unique way as disclosed in this document. Thus, when including such technical features within the artificial intelligence augmented iterative product decoding system, the system is best able to provide a distinguishable benefit for the product-decoding used in tape systems (or other suitable data storage systems).

It is understood that although a number of different embodiments of the artificial intelligence augmented iterative product decoding system have been illustrated and described herein, one or more features of any one embodiment can be combined with one or more features of one or more of the other embodiments, provided that such combination satisfies the intent of the present invention.

While a number of exemplary aspects and embodiments of the artificial intelligence augmented iterative product decoding system have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A method for product decoding within a data storage system, the method comprising:
    receiving data to be decoded within a first decoder;
    performing a plurality of decoding iterations to decode the data utilizing a first decoder and a second decoder, each of the plurality of decoding iterations including:
        (i) decoding the data with the first decoder operating at a first decoder operational mode to generate once decoded data;
        (ii) sending the once decoded data from the first decoder to the second decoder;
        (iii) receiving error information from the first decoder with an artificial intelligence system;
        (iv) selecting a second decoder operational mode based at least in part on the error information that is received by the artificial intelligence system; and
        (v) decoding the once decoded data with the second decoder operating at the second decoder operational mode to generate twice decoded data; and
    outputting fully decoded data based on the performance of the plurality of decoding iterations.

2. The method of claim 1 wherein the step of selecting includes the second decoder operational mode being based at least in part on side information from the first decoder and the error information that is received by the artificial intelligence system.

3. The method of claim 1 wherein the step of decoding the data with the first decoder includes the first decoder operational mode being updated for each of the plurality of decoding iterations.

4. The method of claim 1 further comprising running the artificial intelligence system to feed a correction block and a symbol classifier to determine the first decoder operational mode for the first decoder and the second decoder operational mode for the second decoder.

5. The method of claim 1 wherein for each of the plurality of decoding iterations, the method further comprises receiving second error information from the second decoder with the artificial intelligence system; and wherein the step of selecting includes selecting the second decoder operational mode based at least in part on the error information that is received from the first decoder and the second error information that is received from the second decoder by the artificial intelligence system.

6. The method of claim 1 further comprising processing the data with a detector prior to decoding the data with the first decoder.

7. The method of claim 6 further comprising generating channel reliability information with a channel reliability estimator based on output from the detector; and receiving the channel reliability information with the artificial intelligence system to supplement the error information that is received by the artificial intelligence system.

8. The method of claim 1 wherein the step of receiving error information includes the artificial intelligence system being a joint deep neural network.

9. The method of claim 8 further comprising adding an extra layer to the joint deep neural network for each subsequent decoding iteration.

10. The method of claim 1 wherein for each of the plurality of decoding iterations, the method further comprises assigning one of "Error", "Erasure" and "Correct" with the first decoder for a state of the once decoded data.

11. The method of claim 10 wherein for each of the plurality of decoding iterations, the method further comprises assigning an accuracy to the decoding of one accurate erasure information, false erasure information, unlabeled error and correctly labeled good data.

12. The method of claim 1 wherein the step of decoding the data with the first decoder includes the first decoder being a C1 decoder; and wherein the step of sending the once decoded data from the first decoder to the second decoder includes the second decoder being a C2 decoder.

13. A data storage system comprising:
a product decoding system including:
   a first decoder that is configured to receive data, the first decoder being further configured to operate at a first decoder operational mode to decode the data to generate once decoded data;
   a second decoder that is configured to receive the once decoded data, the second decoder being further configured to operate at a second decoder operational mode to decode the once decoded data to generate twice decoded data; and
   an artificial intelligence system that is configured to receive error information from the first decoder;
wherein the product decoding system is configured to perform a plurality of decoding iterations to decode the data;
wherein the second decoder operational mode is selected based at least in part on the error information that is received by the artificial intelligence system; and
wherein the product decoding system is configured to output fully decoded data based on the performance of the plurality of decoding iterations.

14. The data storage system of claim 13 wherein the second decoder operational mode is selected based at least in part on side information from the first decoder and the error information that is received by the artificial intelligence system.

15. The data storage system of claim 13 wherein the first decoder operational mode is updated for each of the plurality of decoding iterations.

16. The data storage system of claim 13 wherein the artificial intelligence system feeds a correction block and a symbol classifier to determine the first decoder operational mode for the first decoder and the second decoder operational mode for the second decoder.

17. The data storage system of claim 13 wherein the artificial intelligence system is further configured to receive second error information from the second decoder; and wherein the second decoder operational mode is selected based at least in part on the error information that is received from the first decoder and the second error information that is received from the second decoder by the artificial intelligence system.

18. The data storage system of claim 13 further comprising a detector that is configured to process the data before the data is decoded with the first decoder.

19. The data storage system of claim 13 wherein the artificial intelligence system is a joint deep neural network.

20. The data storage system of claim 13 wherein the first decoder is a C1 decoder; and wherein the second decoder is a C2 decoder.

* * * * *